US012261519B2

(12) United States Patent
Giandalia et al.

(10) Patent No.: US 12,261,519 B2
(45) Date of Patent: Mar. 25, 2025

(54) INTEGRATED GALLIUM NITRIDE POWER DEVICE WITH PROTECTION CIRCUITS

(71) Applicant: Navitas Semiconductor Limited, Dublin (IE)

(72) Inventors: Marco Giandalia, Marina Del Ray, CA (US); Jason Zhang, Monterey Park, CA (US); Hongwei Jia, Aliso Viejo, CA (US); Daniel M. Kinzer, El Segundo, CA (US)

(73) Assignee: Navitas Semiconductor Limited, Dublin (IE)

( * ) Notice: Subject to any disclaimer, the term of this patent is extended or adjusted under 35 U.S.C. 154(b) by 0 days.

(21) Appl. No.: 18/463,198

(22) Filed: Sep. 7, 2023

(65) Prior Publication Data
US 2023/0421046 A1 Dec. 28, 2023

Related U.S. Application Data

(62) Division of application No. 17/853,749, filed on Jun. 29, 2022, now Pat. No. 11,791,709.
(Continued)

(51) Int. Cl.
H02M 3/155 (2006.01)
G05F 1/573 (2006.01)
(Continued)

(52) U.S. Cl.
CPC .............. *H02M 1/08* (2013.01); *G05F 1/573* (2013.01); *H02M 1/32* (2013.01); *H02M 3/155* (2013.01);
(Continued)

(58) Field of Classification Search
None
See application file for complete search history.

(56) References Cited

U.S. PATENT DOCUMENTS 5,926,012 A 7/1999 Takizawa et al.
6,351,107 B1 2/2002 Okita
(Continued)

FOREIGN PATENT DOCUMENTS

EP 3787164 A1 3/2021
TW 201233015 A 8/2012
(Continued)

OTHER PUBLICATIONS

U.S. Appl. No. 17/853,746 , "Non-Final Office Action", Sep. 6, 2023, 9 pages.
(Continued)

*Primary Examiner* — Jeffrey S Zweizig
(74) *Attorney, Agent, or Firm* — FisherBroyles, LLP

(57) ABSTRACT

A circuit is disclosed. The circuit includes a first transistor including a first drain terminal, a first gate terminal and a first source terminal, a depletion-mode transistor including a second drain terminal, a second gate terminal and a second source terminal, the second drain terminal connected to the first drain terminal, the depletion-mode transistor arranged to sense a first voltage at the first drain terminal and generate a second voltage at the second source terminal, and a comparator arranged to receive the second voltage, and transition the first transistor from an on state to an off state in response to the first transistor entering its saturation region of operation. In one aspect, the first transistor includes gallium nitride (GaN). In another aspect, the circuit further includes a logic circuit arranged to receive an output voltage generated by the comparator and to drive the first gate terminal.

20 Claims, 15 Drawing Sheets

Related U.S. Application Data

(60) Provisional application No. 63/202,973, filed on Jul. 1, 2021.

(51) Int. Cl.
*H02M 1/08* (2006.01)
*H02M 1/32* (2007.01)
*H02M 3/158* (2006.01)
*H03K 3/012* (2006.01)
*H02H 9/02* (2006.01)

(52) U.S. Cl.
CPC ............ *H02M 3/158* (2013.01); *H03K 3/012* (2013.01); *H02H 9/02* (2013.01); *H03K 2217/0081* (2013.01)

(56) References Cited

U.S. PATENT DOCUMENTS

| | | |
|---|---|---|
| 6,686,729 B1 | 2/2004 | Kawamura et al. |
| 7,839,131 B2 | 11/2010 | Yang et al. |
| 8,278,886 B2 | 10/2012 | Megaw |
| 9,716,430 B1 * | 7/2017 | Trescases ............ H03K 17/284 |
| 10,763,737 B2 | 9/2020 | Hirose |
| 10,931,277 B2 | 2/2021 | Dietrich et al. |
| 11,239,741 B2 | 2/2022 | Miyazawa et al. |
| 11,791,709 B2 | 10/2023 | Giandalia et al. |
| 2018/0026517 A1 | 1/2018 | Mondzik et al. |
| 2019/0123546 A1 | 4/2019 | Wang et al. |
| 2019/0198355 A1 | 6/2019 | Basler et al. |
| 2019/0319471 A1 | 10/2019 | Kinzer |
| 2023/0145803 A1 | 5/2023 | Maeda et al. |

FOREIGN PATENT DOCUMENTS

| | | |
|---|---|---|
| TW | I615699 B | 2/2018 |
| TW | I624930 B | 5/2018 |
| TW | 201937839 A | 9/2019 |

OTHER PUBLICATIONS

U.S. Appl. No. 17/853,749 , "Notice of Allowance", Jun. 13, 2023, 9 pages.
TW111124269 , "Office Action", Feb. 24, 2023, 13 pages.
TW111124269 , "Office Action", Sep. 22, 2023, 6 pages.
U.S. Appl. No. 17/853,749 , Notice of Allowance, Mailed On Jun. 13, 2023, 9 pages.
Application No. TW111124269 , Office Action, Mailed On Feb. 24, 2023, 13 pages.

* cited by examiner ion Ser. No. 17/853,749, for "INTEGRATED GALLIUM
INTEGRATED GALLIUM NITRIDE POWER DEVICE WITH PROTECTION CIRCUITS

CROSS REFERENCE TO RELATED APPLICATIONS

This application is a divisional of U.S. patent application Ser. No. 17/853,749, for "INTEGRATED GALLIUM NITRIDE POWER DEVICE WITH PROTECTION CIRCUITS," filed on Jun. 29, 2022, which claims priority to U.S. provisional patent application Ser. No. 63/202,973, for "INTEGRATED POWER DEVICE WITH ENERGY HARVESTING GATE DRIVER" filed on Jul. 1, 2021, both of which are hereby incorporated by reference in their entirety for all purposes.

FIELD

The described embodiments relate generally to power conversion devices, and more particularly, the present embodiments relate to integrated power conversion devices utilizing gallium nitride (GaN) circuits.

BACKGROUND

Electronic devices such as computers, servers and televisions, among others, employ one or more electrical power conversion circuits to convert one form of electrical energy to another. Some electrical power conversion circuits convert a high DC voltage to a lower DC voltage using a circuit topology called a half bridge converter. As many electronic devices are sensitive to size and efficiency of the power conversion circuit, new power converters can provide relatively higher efficiency and lower size for the new electronic devices.

SUMMARY

In some embodiments, a circuit is disclosed. The circuit includes a first transistor including a first drain terminal, a first gate terminal and a first source terminal, a depletion-mode transistor including a second drain terminal, a second gate terminal and a second source terminal, the second drain terminal connected to the first drain terminal, the depletion-mode transistor arranged to sense a first voltage at the first drain terminal and generate a second voltage at the second source terminal, and a comparator arranged to receive the second voltage and transition the first transistor from an on state to an off state in response to the first transistor entering its saturation region of operation.

In some embodiments, the first transistor includes gallium nitride (GaN).

In some embodiments, the depletion-mode transistor includes GaN.

In some embodiments, the circuit further includes a logic circuit arranged to receive an output voltage generated by the comparator, and to drive the first gate terminal.

In some embodiments, the circuit further includes a logic circuit arranged to receive an output voltage generated by the comparator, and to drive the first and second gate terminals.

In some embodiments, the comparator is further arranged to transition the first transistor from an off-state to an on-state in response to the first transistor exiting its saturation region of operation.

In some embodiments, a power conversion circuit is disclosed. The power conversion circuit includes a package base, a GaN die secured to the package base and including at least a GaN transistor, the GaN transistor including a first gate terminal, a first source terminal and a first drain terminal, and a semiconductor die secured to the package base and including a driver circuit, where the driver circuit includes an input terminal arranged to receive an input signal from an external circuit, and an output terminal coupled to the first gate terminal, where the driver circuit further includes a control circuit, where the control circuit is arranged to sense a rate of change of current as a function of time in the first source terminal and generate a proportional gate drive signal at the first gate terminal.

In some embodiments, the control circuit is further arranged to reduce the proportional gate drive signal at the first gate terminal such that a current generated by the GaN transistor is reduced.

In some embodiments, the control circuit includes a first impedance element and a second impedance element, where the first and second impedance elements are coupled across a connecting element between the GaN die and the package base.

In some embodiments, the control circuit further includes a unidirectional current conductor coupled to the first and second impedance elements.

In some embodiments, the control circuit further includes a second transistor having a second gate terminal, a second source terminal and a second drain terminal, where the second source terminal is coupled to the unidirectional current conductor.

In some embodiments, the second drain terminal is coupled to the first gate terminal.

In some embodiments, the second transistor is arranged to receive a second signal from the unidirectional current conductor and generate a gate drive signal at the first gate terminal that is proportional to the second signal.

In some embodiments, a circuit is disclosed. The circuit includes a first transistor having a first drain terminal, a first gate terminal and a first source terminal, a connecting element coupled to the first source terminal at a first end and to a connection point in an electronic package at a second end, a sensing element coupled to the connecting element in parallel, and arranged to sense a rate of change of current as a function of time in the first source terminal and generate an output voltage, and a second transistor including a second source terminal, second gate terminal and second drain terminal, the second source terminal being coupled to the sensing element, and the second drain terminal being coupled to the first gate terminal, where the second transistor is arranged to receive the output voltage at the second source terminal and generate a gate drive signal at the first gate terminal, and further arranged to reduce the gate drive signal at the first gate terminal such that a current generated by the first transistor is reduced.

In some embodiments, the first transistor includes gallium nitride (GaN).

In some embodiments, the sensing element includes a first impedance element and a second impedance element.

In some embodiments, the first and second impedance elements are coupled to the connecting element.

In some embodiments, the sensing element further includes a unidirectional current conductor coupled to the first and second impedance elements.

In some embodiments, the unidirectional current conductor is coupled to the second source terminal.

In some embodiments, the second transistor is silicon-based.

DETAILED DESCRIPTION

Figure 1:
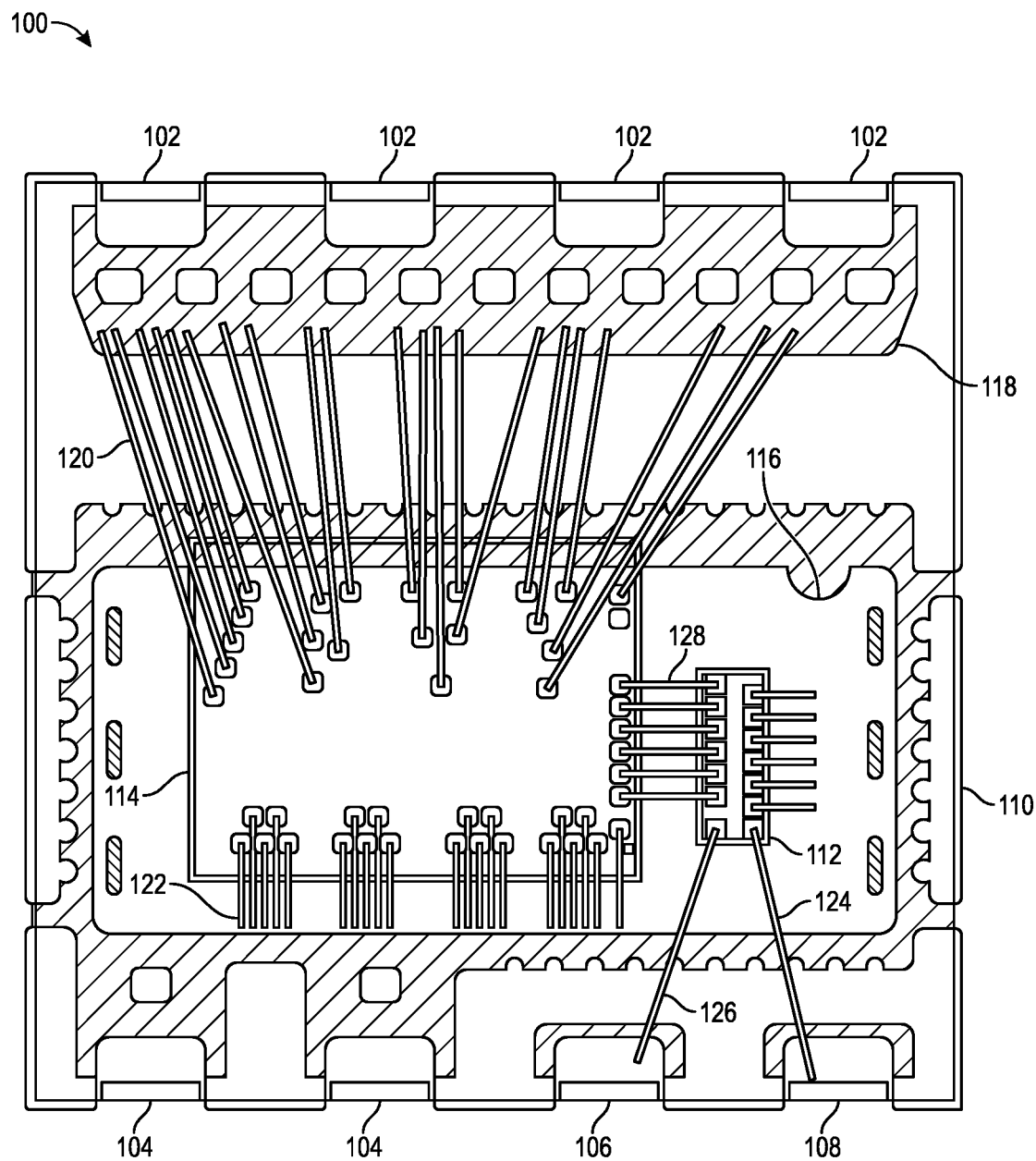
FIG. 1 illustrates an integrated GaN power device, and a silicon device, in the same package, according to an embodiment of the disclosure.

Circuits and related techniques disclosed herein relate generally to gallium nitride (GaN) power conversion devices. More specifically, devices, circuits and related techniques disclosed herein relate to GaN integrated circuits where a gate driver integrated circuit (IC) can be utilized to harvest energy from an input pulse width modulated (PWM) signal for powering the gate driver IC, eliminating a need for a power supply for the gate driver IC. In some embodiments, the gate driver IC can be integrated with a GaN power transistor in a package to form an integrated GaN power device where the integrated GaN power device can be a pin to pin compatible replacement for a discrete silicon power MOSFET and its driving circuits. In various embodiments, the gate driver IC can store the harvested energy from the PWM signal and continue to function and drive the GaN power transistor even when the PWM signal is in a low state as explained further in FIG. 1.

In some embodiments, the gate driver IC can include various protection circuits to keep the GaN power transistor in its safe operating area as summarized here and described in more detail below. More specifically, in some embodiments, the IC may include a pull-down transistor for pulling down the gate voltage of the GaN power transistor. The pull-down transistor may be integrated into the IC or integrated within the same die as the GaN transistor. The IC may drive the gate of the pull-down transistor as explained further in FIG. 2.

In various embodiments, the IC can include a pull-up transistor. The pull-up transistor can enable a PWM signal to drive the gate of the GaN power transistor to a high state. In some embodiments, the IC may include clamping circuits that can protect the GaN power transistor and the internal circuitry of the IC. The clamping circuits can enable relatively high operating voltages for the PWM, for example 10 to 30 V, while allowing the gate of the GaN transistor to be kept within its safe operating region, for example, below 6.0 V. As appreciated by one of ordinary skill in the art having the benefit of this disclosure, the operating voltages can be set to any suitable value. The operation of the pull-up transistor and the clamping circuits are described in greater detail in FIG. 2.

In some embodiments, the IC may include a saturation current protection circuit. The saturation current protection circuit may sense a voltage at the drain of the GaN power transistor and trigger a protection circuit to prevent the GaN transistor from entering or staying into its saturation region. As understood by those skilled in the art, the GaN transistor may operate normally in its linear operating region, however if the GaN transistor enters into its saturation operating region, the drain current can increase with a corresponding drain voltage increase, which is undesirable in power conversion applications. In some embodiments, the saturation protection circuit can use a depletion mode (D-mode) GaN transistor to sense the drain voltage of the GaN transistor and shut down the GaN transistor when saturation is sensed. The saturation protection circuit is discussed in detail in FIGS. 4-6.

In various embodiments, the IC may include a turn-on dv/dt control circuit by utilizing an external resistor in series with the PWM signal. DV/dt control circuits are discussed in detail in FIGS. 7A-C and 8. In various embodiments, the IC may include a turn-off dI/dt control circuit by utilizing package bondwire inductances. The gate of the GaN transistor can be kept in its safe operating area by the use of the turn-off dI/dt control circuit where stress voltage on the gate of the GaN transistor can be kept to relatively minimal values. The turn-off dI/dt control circuit is described in more detail in FIG. 9.

In some embodiments, the IC may include a gate driving voltage generation circuit with hysteresis in order to control a gate voltage of the GaN transistor to reduce power consumption and improve operational speed. The gate driving voltage generation circuit with hysteresis is described in more detail in FIGS. 10-11.

As appreciated by one of ordinary skill in the art having the benefit of this disclosure, any portion of and/or any combination of the features described herein can be integrated within the IC, can be integrated within the GaN transistor or the features can be partially integrated within the IC and partially integrated within the GaN transistor. In various embodiments, the integrated GaN power device can operate at relatively higher frequencies than the silicon power MOSFET it replaces. Further, the IC can be formed in silicon, silicon-carbide, GaN or any other suitable semiconductor material. In various embodiments, the integrated power device can be used in high current and/or high voltage power conversion applications such as (but not limited to) AC to DC converters, and applications such as solar power conversion, automotive and battery charging applications.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Integrated GaN Power Package

FIG. 1 illustrates an integrated GaN power device 100 according to an embodiment of the disclosure. As shown in FIG. 1, integrated GaN power device 100 can include a GaN power transistor 114 and a gate driver integrated circuit (IC) 112 in a semiconductor package 110. By integrating the GaN power transistor 114 and the gate driver IC into a single semiconductor package 110, a majority of package parasitic elements can be eliminated, allowing the use of the integrated GaN power device 100 in high current and high power applications. The integrated GaN power device 100 can include a top slab 118. A drain of the GaN power transistor 114 can be coupled to the top slab 118 through multiple bondwires 120, where the top slab 118 is coupled to multiple pins 102 to form a drain of the integrated GaN power device 100. The integrated GaN power device 100 can further include a die pad 116.

A source of the GaN power transistor 114 can be coupled to the die pad 116 through multiple bondwires 122. The die pad 116 can be coupled to multiple pins 104 to form a source of the integrated GaN power device 100. A ground terminal of the IC 112 can be coupled to pin 106 through bondwire 126 to form a low parasitic (kelvin) source connection for the IC. An input terminal of the IC can be connected to input pin 108 through bondwire 124 to form an input for a drive signal into the integrated GaN power device 100. In some embodiments, the input pin 108 can be coupled to a pulse width modulated (PWM) signal to drive the IC 112. The IC can be coupled to the GaN power transistor 114 through bondwires 128. In numerous embodiments, the IC can be coupled to the GaN power transistor 114 by clips, for example copper clips. In some embodiments, the IC can be coupled to the GaN power transistor 114 by bumps. In various embodiments, the IC 112 can drive the GaN power transistor 114 and can include various features for driving the GaN power transistor and to keep the GaN power transistor in its safe operating area. In the illustrated embodiment, the integrated GaN power device 100 can be used to replace a silicon power MOSFET in various applications. It will be understood by those skilled in the art that the gate driver IC 112 can be utilized to drive GaN high electron mobility transistors (HEMT) as well as other power transistors such as (but not limited to) isolated gate bipolar transistors (IGBT) and silicon MOSFETs.

In various embodiments, gate driver IC 112 can operate without a need for a power supply (Vdd). This feature can eliminate a need for extra pins for Vdd in the package 110 and allow pin-to-pin compatibility of the integrated GaN power device 100 so it is interchangeable with discrete silicon power MOSFETs or other packaged semiconductor devices. In some embodiments, the energy for operation of the IC 112 can be drawn from an input PWM signal when the PWM signal is in a high state and the IC can store the energy on its internal components. The IC can continue to function when the PWM signal is in a low state by utilizing the stored energy. Further, even when the energy stored in the IC has dissipated, the IC can continue to actively pull down the gate of the GaN power transistor 114 in order to prevent a dv/dt event causing an involuntary turn-on.

In the illustrated embodiment, the input pin 108 of the package 110 may draw relatively low amounts of current similar to a gate of a discrete silicon power MOSFET it replaces. Similar to the gate of the silicon power MOSFET, the PWM signal can have two logic states of low and high. For example, in the low state the PWM signal can be at zero volt, while its high state value can be 10 to 30 V. The IC 112 can drive the gate of the GaN power transistor 114 at appropriate voltage values, for example, between 0 to 6 V, even when the PWM signal varies between 0 to 10-30 V. In this way, the IC 112 can keep the gate of the GaN power transistor 114 in its safe operating area even when the PWM signal is above the safe operating voltage of the GaN transistor and prevent damage to the gate of the GaN transistor. As appreciated by one of ordinary skill in the art having the benefit of this disclosure, the value for operating voltages can be set to any suitable value as appropriate for specific applications.

In some embodiments, during power-up the IC 112 can turn on and perform power-up functions to such that the GaN power transistor 114 is kept in its safe operating area during the power-up. The IC 112 can drive the gate of the GaN power transistor 114 while monitoring a status of the GaN power transistor 114 by sensing various characteristics of the GaN transistor such as, but not limited to, over-current, over-voltage characteristics and over-temperature. To eliminate a need for a power pin such as a Vdd pin, the IC 112 may draw power from the input PWM signal and store the energy within its internal capacitors 228. The stored energy can be used by the IC 112 to function even when the PWM signal is in a low state and the GaN transistor 114 has been turned off. During the PWM low state, the IC 112 can continue to function and can actively keep the gate of the GaN power transistor 114 in a low state to prevent the gate from turning on due to a dv/dt event, which may cause damage to the GaN transistor.

In some embodiments, the integrated GaN power device 100 can have little to no leakage current into its input terminal during a stand-by state. In various embodiments, semiconductor packages such as, but not limited to, dual-flat no-leads (DFN) or TO-247 can be utilized to integrate the IC 112 and the GaN power transistor 114 in order to form a pin-to-pin replacement for a discrete silicon power MOSFETs, silicon carbide (SiC) FETs, or other power devices without a need to modify a printed circuit board (PCB) layout. As understood by those skilled in the art, in some applications it can be difficult to use GaN power transistors in transistor outline (TO-type) power packages, such as three-terminal or four-terminal TO-247 or TOLL package, due to the relatively high parasitic inductance of the package that can cause excessive ringing and oscillations in high current applications. In the illustrated embodiment, the GaN power transistor 114 can be used in a TO-type packages, such as but not limited to three-terminal TO-247, four terminal TO-247 and TOLL package, by integrating the gate driver IC 112 into the TO package along with the GaN power transistor 114 where various features of the gate driver IC, such as, but not limited to, dv/dt control and dI/dt control, can enable the use of GaN power transistors in a TO package. Further, the integrated GaN power device 100 can be used for pin-to-pin replacement of discrete power MOSFETs, silicon carbide (SiC) FETs, or other power devices without a need to modify a printed circuit board (PCB) layout. As appreciated by one of ordinary skill in the art having the benefit of this disclosure, other suitable semiconductor packages may be used for the integration of the GaN power transistor 114 and gate driver IC 112, as appropriate for specific applications.

Figure 2:
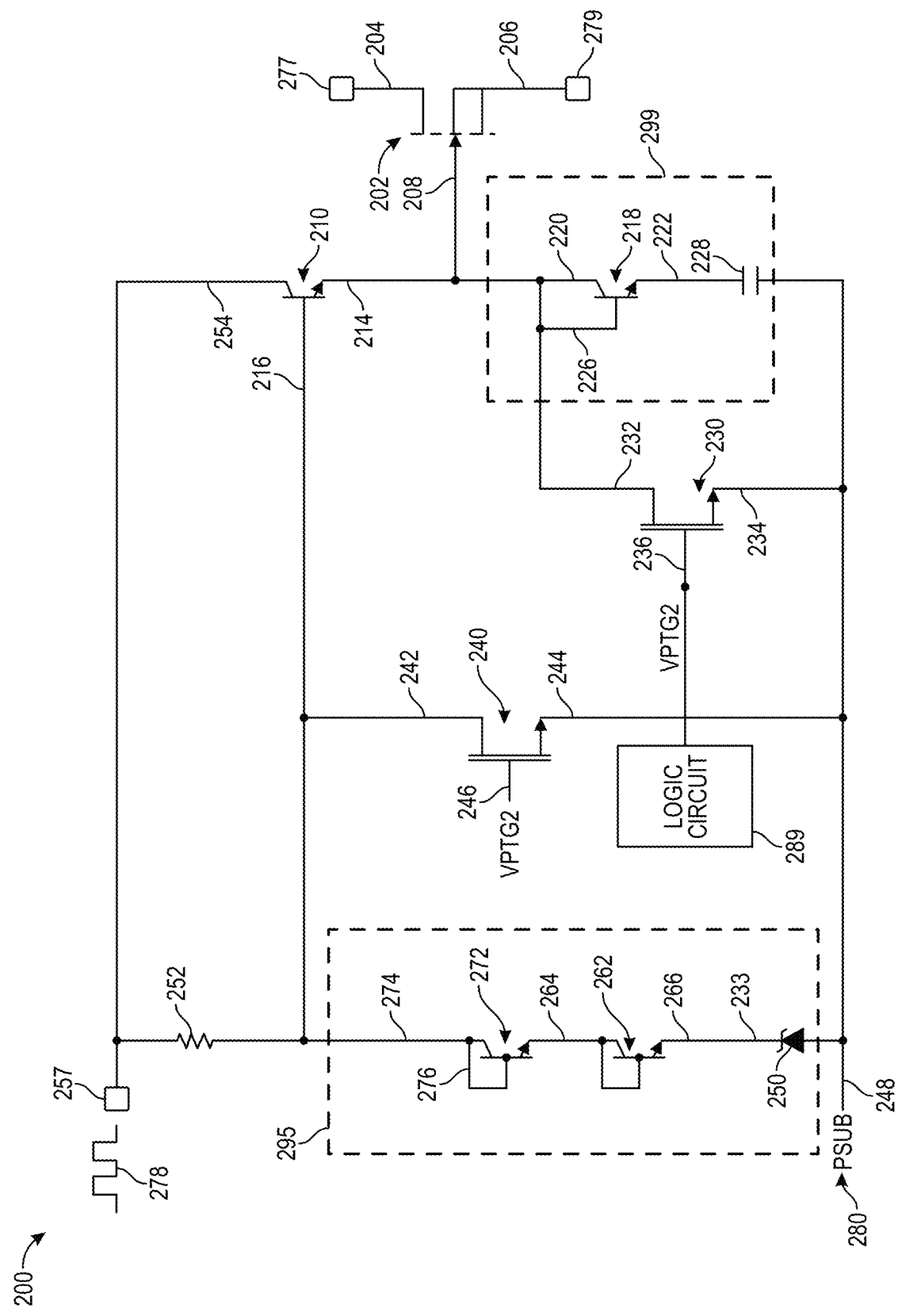
FIG. 2 illustrates schematic of a gate driver circuit with energy harvesting, integrated pull-up and pull-down transistors, and voltage clamping features according to an embodiment of the disclosure.

Energy Harvesting Circuits, Integrated Pull-Up and Pull-Down Transistor Circuits, and Voltage Clamping Circuits FIG. 2 illustrates schematic of a circuit 200 with energy harvesting, integrated pull-up and pull-down transistors, and voltage clamping features according to embodiments of the disclosure. In some embodiments, circuit 200 can be used in the integrated GaN power device 100. As shown in FIG. 2, circuit 200 can include a GaN power transistor 202 having a gate 208, a drain 204 and a source 206. In some embodiments, the GaN power transistor 202 is similar to the GaN power transistor 114. Drain 204 may be coupled to a pin 277, and the source 206 may be coupled to a pin 279. In some embodiments, the drain 204 and source 206 may not be coupled to pins, instead they may be coupled to other circuit nodes that are monolithically integrated with the GaN power transistor 202. Circuit 200 can further include an input terminal pin 257 that is configured to receive a signal 278. In some embodiments, the signal 278 can be a pulse width modulated (PWM) signal. The input terminal pin 257 can be connected to a pull-up transistor 210 with a collector 254, a base 216, and a source 214. In various embodiments, the pull-up transistor 210 can be a bipolar NPN transistor, while in other embodiments it can be a P-MOSFET. In some embodiments, pull-up transistor 210 can be a N-MOSFET. In various embodiments, pull-up transistor 210 can be formed in a compound semiconductor substrate, or any other suitable substrate. In some embodiments, the pull-up transistor 210 can be integrated within the gate driver IC 112. In various embodiments, the pull-up transistor can be a GaN-based transistor and integrated in the same die as that of the GaN power transistor 202.

The source 214 can be connected to a gate 208 of a GaN power transistor 202. In some embodiments, the GaN power transistor 202 along with circuit 200 can be arranged to be used in a low-side configuration. In various embodiments, the GaN power transistor 202 along with circuit 200 can be arranged to be used in a half-bridge configuration. In some embodiments, the GaN power transistor 202 along with circuit 200 can be arranged to be used in a high-side configuration. When signal 278 is in a high state, pull-up transistor 210 can be turned-on, thereby allowing a current to flow into the gate 208, thus charging a capacitance of the gate 208. This can cause the GaN power transistor 202 to turn on. In various embodiments, the pull-up transistor 210 can be a bipolar NPN transistor, while in other embodiments pull-up transistor 210 can be a P-MOSFET. In some embodiments, transistor 210 can be a N-MOSFET. In various embodiments, transistor 210 can be formed in a compound semiconductor substrate, or any other suitable substrate. The pull-up transistor 210 can be integrated within the gate driver IC 112, or it can be a GaN-based transistor and integrated into the same die as that of the GaN power transistor 202.

The signal 278 can provide power to the base 216 of the pull-up transistor 210 through resistor 252. When the signal 278 goes high, pull-up transistor 210 can pull up the gate 208 of the GaN power transistor 202 high by providing a current to charge the gate 208. Circuit 200 can include a substrate terminal 248 which can be connected to a substrate 280 of the IC 112 die. In various embodiments, the substrate 280 can be connected to ground. Circuit 200 can include a pull-down transistor 230 with a gate terminal 236, a source terminal 234 and a drain terminal 232. The drain terminal 232 of the pull-down transistor 230 can be connected to the gate 208 of the GaN power transistor 202 and the source terminal 234 of the pull-down transistor 230 can be connected to the source 206 of the GaN power transistor 202 and substrate 248. The pull-down transistor is arranged to pull down the gate 208 of the GaN power transistor 202 when PWM signal is in a low state. The gate terminal 236 of the pull-down transistor 230 can be connected to a logic circuit 289 and be driven by a signal $V_{ptg2}$ generated by the logic circuit 289. When PWM signal goes low, signal $V_{ptg2}$ can go high which can turn on the pull-down transistor 230 resulting in the drain terminal 232 going low and pulling down the gate 208 of the GaN power transistor 202. The pull-down transistor 230 can be formed within the same die as the gate driver circuit, or can be GaN-based and formed within the same die as the GaN power transistor 202 and integrated in the same die as that of the GaN power transistor 202. The pull-down transistor 230 can be a relatively large transistor in order to provide a solid pull down of the gate 208 of the GaN power transistor 202.

In some embodiments, circuit 200 can include a clamping circuit 295. The clamping circuit 295 can clamp the gate 208 of the GaN power transistor 202 to such that the gate stays within its safe operating area. The clamping circuit 295 can enable the PWM signal to have a wide range of operating voltages, for example 10 to 30 V, while keeping the gate 208 of the GaN power transistor 202 within its safe operating area, for example, below 6.0 V. As appreciated by one of ordinary skill in the art having the benefit of this disclosure, the operating voltages can be set to any suitable value. The clamping circuit 295 can include a Zener diode 250, and two diode-connected NPN transistors, 262 and 272.

Source 266 of transistor 262 can be connected to the Zener diode 250. Collector 268 can be connected to base of the transistor 262 and to the source 264 of transistor 272. Transistor 272 can have a collector 274 connected to its base 276, where the collector 274 is also connected to the base 216 of the pull-up transistor 210. The Zener diode 250 can generate a voltage ($V_z$) at its cathode 233. The value of $V_z$ can be, for example, 5.2 V. The diode-connected transistors 262 and 272 can generate a voltage drop of, for example, 0.7 V each across their collector to source terminals. Thus, a voltage at the base 216 of transistor 210 can be $V_z+2V_{be}$. It will be understood by those skilled in the art that the order that these three devices are connected can be different, while the generated voltage is $V_z+2V_{be}$. The voltage at the gate 208 for the GaN power transistor 202 can be one $V_{be}$ below the voltage at the base 216. Therefore, the voltage the gate 208 of the GaN power transistor 202 can be $V_z+V_{be}$. This voltage can have a value, for example, 5.9 V, thus clamping the gate 208 to voltages below 6.0 V, preventing the gate 208 from exceeding its safe operating voltage.

Circuit 200 can include a clamping circuit 295. The clamping circuit 295 can clamp the gate 208 of the GaN power transistor 202 such that the gate 208 stays within its safe operating area. The clamping circuit 295 can enable the PWM signal to have a wide range of operating voltage, for example 10 to 30 V, while keeping the gate 208 of the GaN power transistor 202 within its safe operating area, for example, below 6.0 V. As appreciated by one of ordinary skill in the art having the benefit of this disclosure, the PWM operating voltages can be set to any suitable value. The clamping circuit 295 can include a Zener diode 250, and two diode-connected NPN transistors, 262 and 272. Transistor 262 has a source 266 which can be connected to the Zener diode 250 and has a collector 268 which can be connected to the base of the transistor 262 and to the source 264 of transistor 272.

Transistor 272 can have a collector 274 which can be connected to the base 216 of the pull-up transistor 210. The Zener diode can generate a voltage Vz at its cathode 233, which can be, for example, 5.2 V. The diode-connected transistors 262 and 272 can generate a voltage drop of, for example, 0.7 V each across their collector to source terminals. Thus, a voltage at the base 216 can be $V_z+2V_{be}$. The voltage at the gate 208 for the GaN power transistor 202 can be one $V_{be}$ below the voltage at the base 216 of transistor 210. Therefore, the voltage at the gate 208 of the GaN power transistor 202 can be $V_z+V_{be}$. This voltage can have a value, for example, 5.9 V. Thus, the clamping circuit 295 can clamp the gate 208 to voltages below 5.9 V and prevent the gate 208 from exceeding its safe operating voltage. As appreciated by one of ordinary skill in the art having the benefit of this disclosure, the output voltage of the clamping circuit can be set to any suitable value. In some embodiments, transistor 262 can be an NPN bipolar transistor that is diode-connected. The diode-connected transistor 262 can mitigate temperature variations of $V_z$. In various embodiments, transistor 272 can mitigate manufacturing process variations as well as temperature variations of characteristics of transistor 210. It will be understood by those skilled in the art that the order that transistors 262 and 272 are connected can be different, while the mitigating temperature and manufacturing process variations.

Circuit 200 can include an energy harvesting and storage circuit 299. Storage circuit 299 can include a transistor 218 connected in series with an energy storing capacitor 228. In some embodiments, transistor 218 can be a configured as a diode-connected transistor. In various embodiments, a diode may be used instead of transistor 218. Transistor 218 can have a collector terminal 220, a source terminal 222 and a base terminal 226. The collector terminal 220 can be connected to base terminal 226. Source terminal 222 can be connected to the capacitor 228. When PWM signal goes high, transistor 210 can turn on causing transistor 218 to turn on as well. The capacitor 228 can charge up and store energy from the PWM signal. Thus, a voltage can develop at source terminal 222 of transistor 218 equal to $V_z$, because while voltage at source 214 of transistor 210 is $V_z+V_{be}$, the voltage at source terminal 222 of transistor 218 can be one $V_{be}$ below the voltage at source 214 of transistor 210. The voltage at source terminal 222 of transistor 218 can be, for example, 5.2 V. This voltage can be used to power up the circuitry within the IC 112, even when the PWM signal goes low. In some embodiments, the present disclosure includes methods for generating a voltage at the gate of the GaN power transistor 202 and storing a regulated voltage in a storage element, such as capacitor 228.

Circuit 200 can include a transistor 240 which can be used to turn off the charging of the gate 208 of the GaN power transistor 202 when PWM goes low. The drain 242 of transistor 240 can be connected to the base 216 of pull-up transistor 210 and the source 244 of transistor 240 can be connected to the substrate 248. The gate 246 of the transistor 240 can be configured to receive a signal $V_{ptg2}$. When signal 278 goes low, signal $V_{ptg2}$ 246 can go high and turn on both transistors 230 and 240. Pull-down transistor 230 can pull down the gate of GaN power transistor 202 and transistor 240 can pull down the base 216 of the pull-up transistor 210, thus turning it off. By turning off the pull-up transistor 210, the charging of the gate 208 of the GaN power transistor 202 can be stopped.

Figure 3:
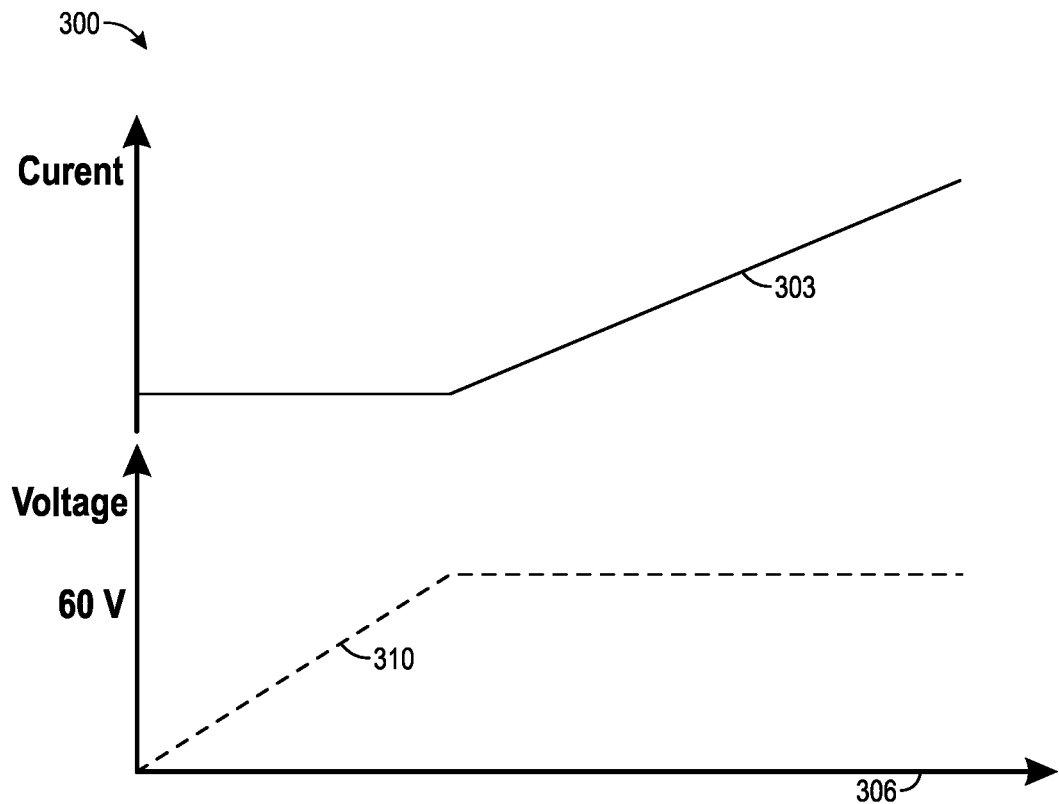
FIG. 3 shows a graph of a quiescent current at an input terminal of the gate driver circuit shown in FIG. 2 and a graph of a gate voltage of the GaN power transistor shown in FIG. 2.

FIG. 3 shows a graph 300 of a quiescent current at input terminal pin 257 of circuit 200 in FIG. 2 and a graph 310 showing a gate voltage of the GaN power transistor 202 of circuit 200 in FIG. 2. Graph 308, showing the quiescent current, graph 310 showing gate voltage have been plotted as a function of PWM voltage 306. As shown in FIG. 3, as PWM voltage 306 increases, the gate voltage of the GaN power transistor increases linearly as the gate charges. The gate voltage increases to about 6.0 V and is clamped at that voltage because the clamping circuit 295 clamps the gate 208 of the GaN power transistor 202. Further, graph 308 shows that there is no static current flowing into the PWM terminal prior to the gate getting clamped. There is no current until the clamping circuit 295 is activated. When the gate 208 gets clamped, the quiescent current increases linearly. In some embodiments this feature can make the integrated GaN power device 100 compatible with discrete power applications since its stand-by gate current is zero.

Saturation Current Protection Circuits

Figure 4A:
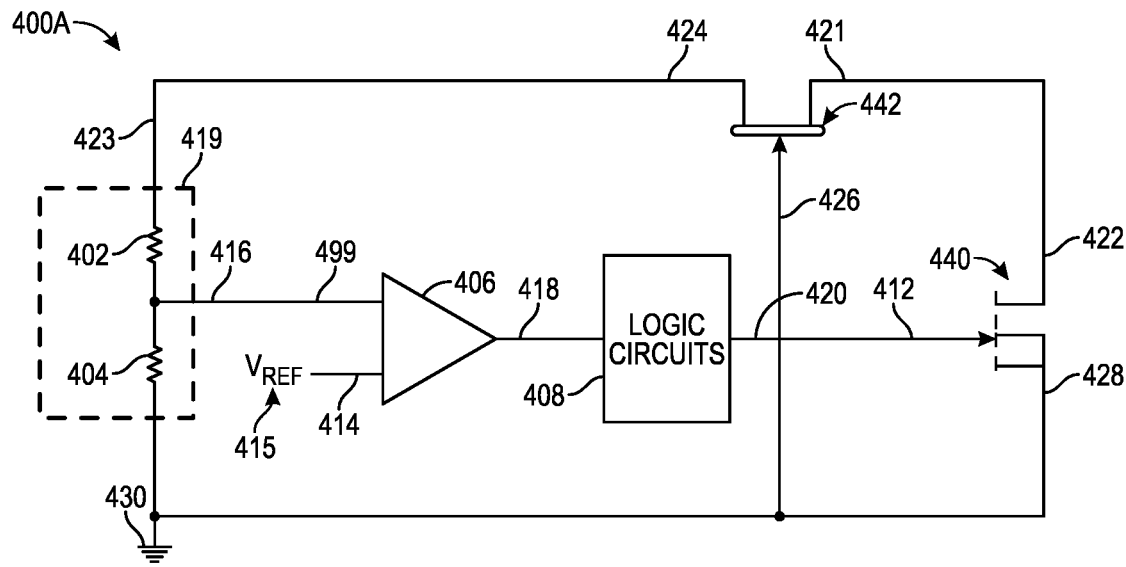
FIG. 4A illustrates schematic of a circuit with saturation current protection feature according to an embodiment of the disclosure.

FIG. 4A illustrates schematic of a circuit 400A with saturation current protection feature according to an embodiment of the disclosure. As shown in FIG. 4A, circuit 400A can include a GaN power transistor 440 with a gate 412, a drain 422 and a source 428. The drain 422 can be connected to a load. Circuit 400A can be utilized to detect when the GaN power transistor 440 enters its saturation operating region. Operation in a saturation region can occur when the drain current of a transistor increases while its drain-to-source voltage stays relatively constant.

As shown in FIG. 4A, the source 428 of the GaN power transistor 440 can be connected to a ground node 430. Circuit 400A can monitor a drain voltage of the GaN power transistor by using a GaN transistor 442. In some embodiments, transistor 442 can be a depletion mode GaN transistor. While the GaN power transistor 440 can be a high voltage transistor, with operational voltages of, for example, 400 V, circuit 400A can be a low voltage circuit for monitoring the GaN power transistor 440 and prevent it from operating in the saturation region. In the illustrated embodiment, a voltage at the drain 422 of the GaN power transistor 440 can be monitored and when that voltage exceeds a threshold, for example 8 V, circuit 400A can turn off the GaN power transistor 440 to protect it from getting damaged, thus preventing damage to the power converter. More specifically, in some embodiments, circuit 400A can use a depletion mode (D-mode) GaN transistor 442, where the drain 422 of the GaN power transistor 440 is connected to the drain 421 of transistor 442. The gate 426 of transistor 442 can be connected to ground node 430. A source 424 of transistor 442 can be connected to a resistor divider 419.

Circuit 400A can include a comparator 406 and logic circuits 408. In some embodiments, resistor divider 419, comparator 406 and logic circuits 408 can be formed in low voltage silicon technology. In various embodiments, resistor divider 419, comparator 406 and logic circuits 408 can be formed in a GaN technology and integrated within the same die as the GaN power transistor 440. In some embodiments, resistor divider 419 can include two resistors 402 and 404 connected in series. An output 416 of the resistor divider can be connected to a first input 499 of comparator 406, while a second input 414 of the comparator 406 can be connected to a reference voltage ($V_{ref}$) 415. Reference voltage 415 can have a value, for example, 2.5 V. An output 418 of the comparator can be connected to logic circuits 408. A voltage at drain 422 of the GaN power transistor 440 can vary, for example, from 0 to 400 V. The source 424 of D-mode GaN transistor 442 can be clamped at its pinch-off voltage, for example, 15 V.

The source 424 of D-mode GaN transistor 442 follows the drain voltage of GaN power transistor 440 until its pinch-off voltage is reached. After that, the source 424 of D-mode GaN transistor 442 is clamped at a pinch-off voltage, for example 15 V. In some embodiments, the source voltage of the D-mode GaN transistor 442 follows its drain voltage until the source voltage reaches the pinch-off voltage of the transistor. At that point, the source voltage gets clamped to the pinch-off voltage and stays constant at that voltage. In this way, the D-mode GaN transistor 442 can enable connection of its source 424 to resistor divider 419, while the drain 421 of the D-mode GaN transistor 442 can operate at high voltage, for example up to 400 V. When the voltage at source 424 of D-mode GaN transistor 442 passes a preset value, for example 8 V, it can cause a shutdown of the GaN power transistor 440.

Resistor divider 419 can provide an output 416 which tracks its input at node 423, but at a lower voltage level. The output voltage of the resistor divider 419 can be compared to a reference voltage 415, for example 2.5 V, which is a threshold of the comparator 406. When the voltage at input 499 of the comparator exceeds $V_{ref}$, comparator 406 can switch and its output 418 voltage can go from a low state to high state. The output 418 of the comparator 406 can be connected to logic circuits 408. When the output 418 of the comparator goes to a high state, the output 420 of the logic circuits 408 turns off the gate of the GaN power transistor 440 and shuts down the GaN power transistor 440. It will be understood by those skilled in the art, that transistor 442 can be a D-mode GaN transistor which can be integrated within the same die as that of GaN power transistor 440. In some embodiments, transistor 442 can be an enhancement-mode GaN transistor. In various embodiments, transistor 442 can be a silicon transistor.

Figure 4B:
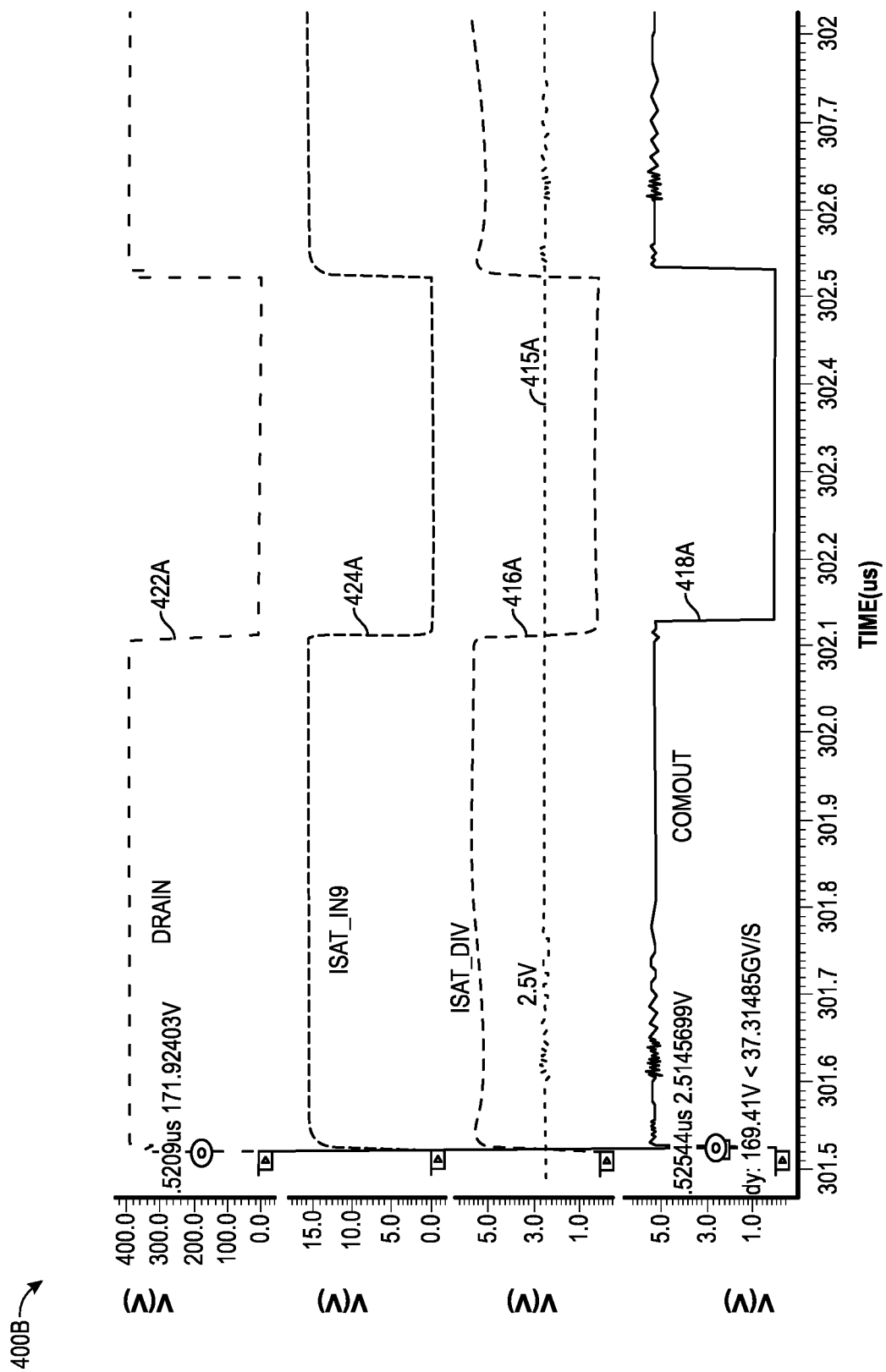
FIG. 4B illustrates a graph showing voltages as a function of time for various nodes within the circuit of FIG. 4A.

FIG. 4B illustrates a graph 400B showing voltages of nodes within circuit 400A as a function of time. Graph 422*a* shows drain voltage of GaN power transistor 440 where that voltage can go from 0 volt to 400 V. Graph 424*a* shows source voltage of D-mode GaN transistor 442 following the drain voltage of GaN power transistor 440 (graph 422*a*). As shown in graph 424*a*, the source voltage goes from 0 V to 15 V, where the source of the D-mode GaN transistor 442 is clamped at 15 V. Graph 416*a* shows the output 416 voltage of the resistor divider 419. Graph 415*a* shows the value of $V_{ref}$ at 2.5 V. Finally, graph 418*a* shows the output voltage of comparator 406, where the comparator switches from a low state to high state when 416*a* (output of the resistor divider) crosses 415*a* ($V_{ref}$). As appreciated by one of skill in the art, the voltages shown in graph 400B are for example only and other embodiments may have different operating characteristics.

Figure 5:
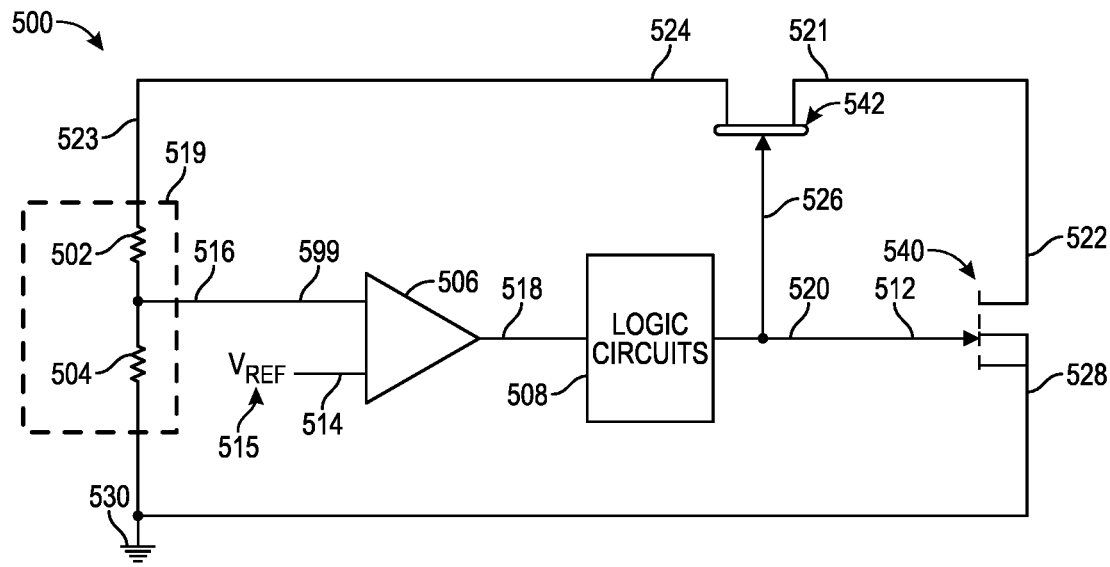
FIG. 5 illustrates schematic of a circuit with saturation current protection feature according to an embodiment of the disclosure.

FIG. 5 illustrates a schematic of a circuit 500 that includes a saturation current protection feature, according to an embodiment of the disclosure. Circuit 500 is similar to circuit 400A except gate 526 of transistor 542 is connected to gate 512 of the GaN power transistor 540. This enables the use of low pinch-off, for example 5 V, D-mode GaN transistors for sensing a drain voltage at the drain 522 of the GaN power transistor 540. In order to monitor a drain voltage of GaN power transistor 540 using D-mode GaN transistor 542 with a low pinch-off voltage, dynamic biasing of the gate 526 can be used in order to allow for proper operation of the D-mode GaN transistor. Dynamic biasing can increase a gate voltage of the D-mode GaN transistor 542 and provide for the gate-to-source voltage of the D-mode GaN transistor to vary instead of being fixed.

Circuit 500 can be used to detect when the GaN power transistor 440 enters its saturation operating region. The source 528 of the GaN power transistor 540 can be connected to a ground node 530. Circuit 500 can monitor a drain voltage of the GaN power transistor by using a transistor 542. While the GaN power transistor 540 can be a high voltage transistor with operational voltage of, for example 400 V, circuit 500 can utilize low voltage circuits to monitor the GaN power transistor and prevent it from operating in the saturation region. In some embodiments, this can be done by monitoring a voltage at the drain 522 of the GaN power transistor 540 and when the voltage exceeds a threshold, for example 8 V, circuit 500 can turn off the GaN power transistor to protect it from getting damaged. More specifically, circuit 500 can use a D-mode GaN transistor 542, where the drain 522 of the GaN power transistor 540 is connected to the drain 521 of transistor 542. Circuit 500 can include a comparator 506 and logic circuits 508.

In some embodiments, resistor divider 519, comparator 506 and logic circuits 508 can be formed in low voltage silicon technology. In various embodiments, resistor divider 519, comparator 506 and logic circuits 508 can be formed in a GaN technology and integrated within the same die as the GaN power transistor 540. Resistor divider 519 can include two resistors 502 and 504 connected in series. An output 516 of the resistor divider can be connected to a first input of comparator 506, while a second input 514 of the comparator 506 can be connected to a reference voltage ($V_{ref}$) 515. Reference voltage 515 can have a value, for example, 2.5 V. An output 518 of the comparator can be connected to logic circuits 508. A voltage at drain 522 of the GaN power transistor 540 can vary, for example, from 0 to 400 V. The source 524 of the transistor 542 is clamped at its pinch-off voltage, for example, 15 V. The source 524 of transistor 542 follows the drain voltage of GaN power transistor 540 until its pinch-off voltage is reached. After that, the source 524 of transistor 542 is clamped at the pinch-off voltage, for example 15 V. Transistor 542 has a characteristic that its source voltage follows its drain voltage until the source voltage reaches the pinch-off voltage of the transistor. At that point, the source voltage gets clamped to the pinch-off voltage and stays constant at that voltage. In this way, the D-mode GaN transistor 542 can enable connection of its source 524 to the low voltage resistor divider 519, while the drain 521 of the D-mode GaN transistor 542 can operate at high voltage, for example up to 400 V. When the voltage at source 524 of transistor 542 passes a preset value, for example 8 V, it can cause a shutdown of the GaN power transistor 540.

Resistor divider 519 can provide an output at 516 which tracks its input at node 523, but at a lower voltage level. The output voltage of the resistor divider 519 can be compared to a reference voltage 515, for example 2.5 V, which is a threshold of the comparator 506. When the voltage at input 599 of the comparator exceeds $V_{ref}$, comparator 506 can switch its output voltage at 518 from a low state to high state. The output 518 of the comparator 506 can be connected to logic circuits 508. When the output 518 goes to a high state, the output 520 of the logic circuits 508 turns off the gate of the GaN power transistor 540 and shuts down the GaN power transistor 540. It will be understood by those skilled in the art, that transistor 542 can be a D-mode GaN transistor which can be integrated within the same die as that of GaN power transistor 540. In some embodiments, transistor 542 can be an enhancement-mode GaN transistor. In various embodiments, transistor 542 can be a silicon transistor.

Figure 6:
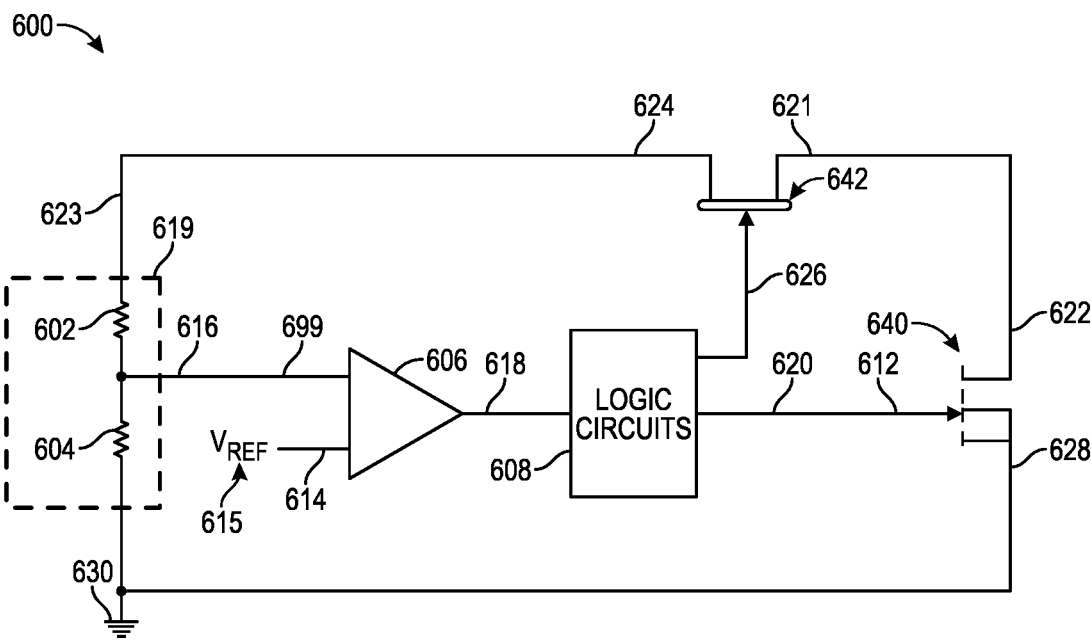
FIG. 6 illustrates schematic of a circuit with saturation current protection feature according to an embodiment of the disclosure.

FIG. 6 illustrates schematic of a circuit 600 with a saturation current protection feature, according to an embodiment of the disclosure. Circuit 600 is similar to circuit 400A except gate 626 of transistor 642 is connected to an output of logic circuits 608 and is independently controlled by the logic circuits 608. This enables the use of low pinch-off, for example 5 V, D-mode GaN transistors for sensing a drain voltage at the drain 622 of the GaN power transistor 640. In order to monitor a drain voltage of GaN power transistor 640 using D-mode GaN transistor 642 with a low pinch-off voltage, independent biasing of the gate 626 can be used in order to allow for proper operation of the D-mode GaN transistor. Dynamic biasing can increase a gate voltage of the D-mode GaN transistor 642 and provide for the gate-to-source voltage of the D-mode GaN transistor to vary instead of being fixed.

Circuit 600 can be used to detect when the GaN power transistor 640 enters its saturation operating region. The source 628 of the GaN power transistor 640 can be connected to a ground node 630. Circuit 600 can monitor a drain voltage of the GaN power transistor by using a transistor 642. While the GaN power transistor 640 can be a high voltage transistor, with operational voltage of for example 400 V, circuit 600 can utilize low voltage circuits to monitor the GaN power transistor and prevent it from operating in the saturation region. This can be done by monitoring a voltage at the drain 622 of the GaN power transistor 640 and when the voltage exceeds a threshold, for example 8 V, circuit 600 can turn off the GaN power transistor to protect it from getting damaged. More specifically, circuit 600 can use a D-mode GaN transistor 642, where the drain 622 of the GaN power transistor 640 is connected to the drain 621 of transistor 642.

Circuit 600 can include a comparator 606 and logic circuits 608. In some embodiments, resistor divider 619, comparator 606 and logic circuits 608 can be formed in low voltage silicon technology. In various embodiments, resistor divider 619, comparator 606 and logic circuits 608 can be formed in a GaN technology and integrated within the same die as the GaN power transistor 640. Resistor divider 619 can include two resistors 602 and 604 connected in series.

An output 616 of the resistor divider can be connected to a first input of comparator 606, while a second input 614 of the comparator 606 can be connected to a reference voltage ($V_{ref}$) 615. Reference voltage 615 can have a value, for example, 2.5 V. An output 618 of the comparator can be connected to logic circuits 608.

A voltage at drain 622 of the GaN power transistor 640 can vary, for example, from 0 to 400 V. The source 624 of transistor 642 is clamped at its pinch-off voltage, for example, 15 V. The source 624 of transistor 642 follows the drain voltage of GaN power transistor 640 until its pinch-off voltage is reached. After that, the source 624 of transistor 642 is clamped at the pinch-off voltage, for example 15 V. Transistor 642 has a characteristic that its source voltage follows its drain voltage until the source voltage reaches the pinch-off voltage of the transistor. At that point, the source voltage gets clamped to the pinch-off voltage and stays constant at that voltage. In this way, the D-mode GaN transistor 642 can enable connection of its source 624 to the resistor divider 619, while the drain 621 of the D-mode GaN transistor 642 can operate at high voltage, for example up to 400 V. When the voltage at source 624 of transistor 642 passes a preset value, for example 8 V, it can cause a shutdown of the GaN power transistor 640.

Resistor divider 619 can provide an output at 616 which tracks its input at node 623, but at a lower voltage level. The output voltage of the resistor divider 619 can be compared to a reference voltage 615, for example 2.5 V, which is a threshold of the comparator 606. When the voltage at input 699 of the comparator exceeds $V_{ref}$, comparator 606 can switch the output 618 voltage from a low state to high state. The output 618 of the comparator 606 can be connected to logic circuits 608. When the output 618 goes to a high state, the output 620 of the logic circuits 608 turns off the gate 612 of the GaN power transistor 640 and shuts down the GaN power transistor 640. It will be understood by those skilled in the art, that transistor 642 can be a D-mode GaN transistor which can be integrated within the same die as that of GaN power transistor 640. In some embodiments, transistor 642 can be an enhancement-mode GaN transistor. In various embodiments, transistor 642 can be a silicon transistor.

Turn-on dv/dt Control

Figure 7A:
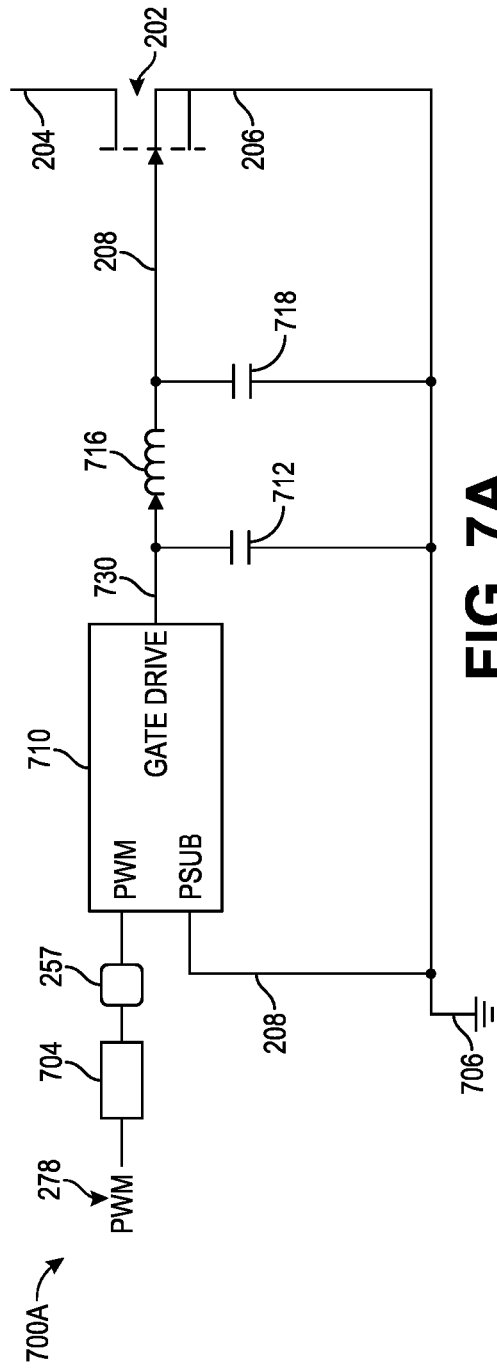
FIG. 7A illustrates schematic of a circuit with turn-on dv/dt control feature according to an embodiment of the disclosure.

FIG. 7A illustrates schematic of a circuit 700A with turn-on dv/dt control feature according to an embodiment of the disclosure. Circuit 700A can be used to mitigate the relatively high parasitic inductances of electronic packages such as, but not limited to, TO-247 or TOLL packages. Circuit 700A illustrate a variation of circuit 200. Circuit 700A illustrates a GaN power transistor 202 along with a driver IC 710 and turn-on dV/dt control circuits. Circuit 700A can include an impedance element 704. In some embodiments, circuit 200 may be coupled to an impedance element 704. Impedance element may be external to the integrated GaN power device 100. In various embodiments, impedance element 704 can include one or more passive components. In some embodiments, impedance element 704 can be a resistive element, while in other embodiments impedance element 704 can include a resistive element and a capacitive element, where the capacitive element is coupled in parallel to the resistive element. In various embodiments, the impedance element 704 may include a network of resistive and capacitive elements. Impedance element 704 can be coupled to the input terminal pin 257. Impedance element 704 can be configured to receive a signal 278. Impedance element 704 can be utilized to control rate of change of voltage as a function of time (dV/dt) for the GaN power transistor 202. As discussed above in FIG. 1, integrated GaN power device 100 may be used as a pin-to-pin replacement for discrete silicon power MOSFETs, therefore a capability to control the dV/dt at the drain 204 of the GaN power transistor 202 can be beneficial. In absence of a dV/dt control circuit, spurious dV/dt may cause ringing and oscillations at the drain 204 that may couple onto the gate 208 and create a false turn-on of the GaN power transistor 202.

A GaN power transistor 202 turn-on dV/dt control can be achieved by utilizing an impedance element 704. The impedance element 704 can be used to slow down a relatively rapid rate of change of voltage as a function of time at the input terminal pin 257. Gate drive node 730 can be connected to gate 208 of the GaN power transistor 202. Capacitors 712 and 718, and inductor 716 are package parasitic elements. Substrate can be grounded at node 706 and connected to source 206 of the GaN power transistor 202. In some embodiment, impedance element 704 can be integrated in the gate driver IC. In various embodiments, a current through input terminal pin 257 flowing to the gate of the GaN power transistor 202 can be limited by limiting a current of the pull-up transistor 210 in order to control turn-on dv/dt. This can be achieved by reducing a gate drive of the pull-up transistor 210.

Figure 7B:
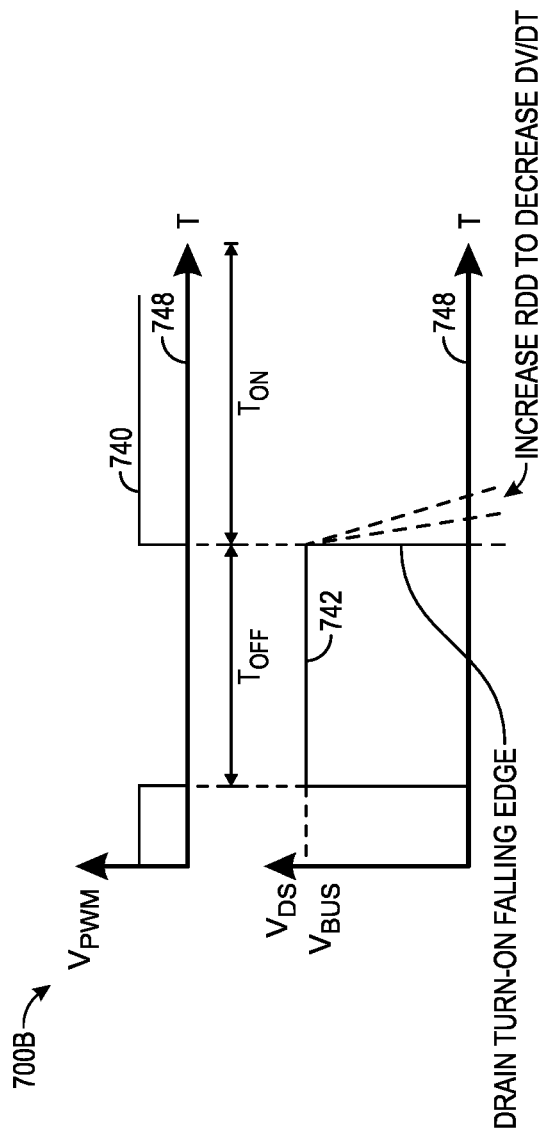
FIG. 7B illustrates a graph showing rate of change of drain-to-source voltage as a function of time during turn-on of a GaN power transistor.
Figure 7C:
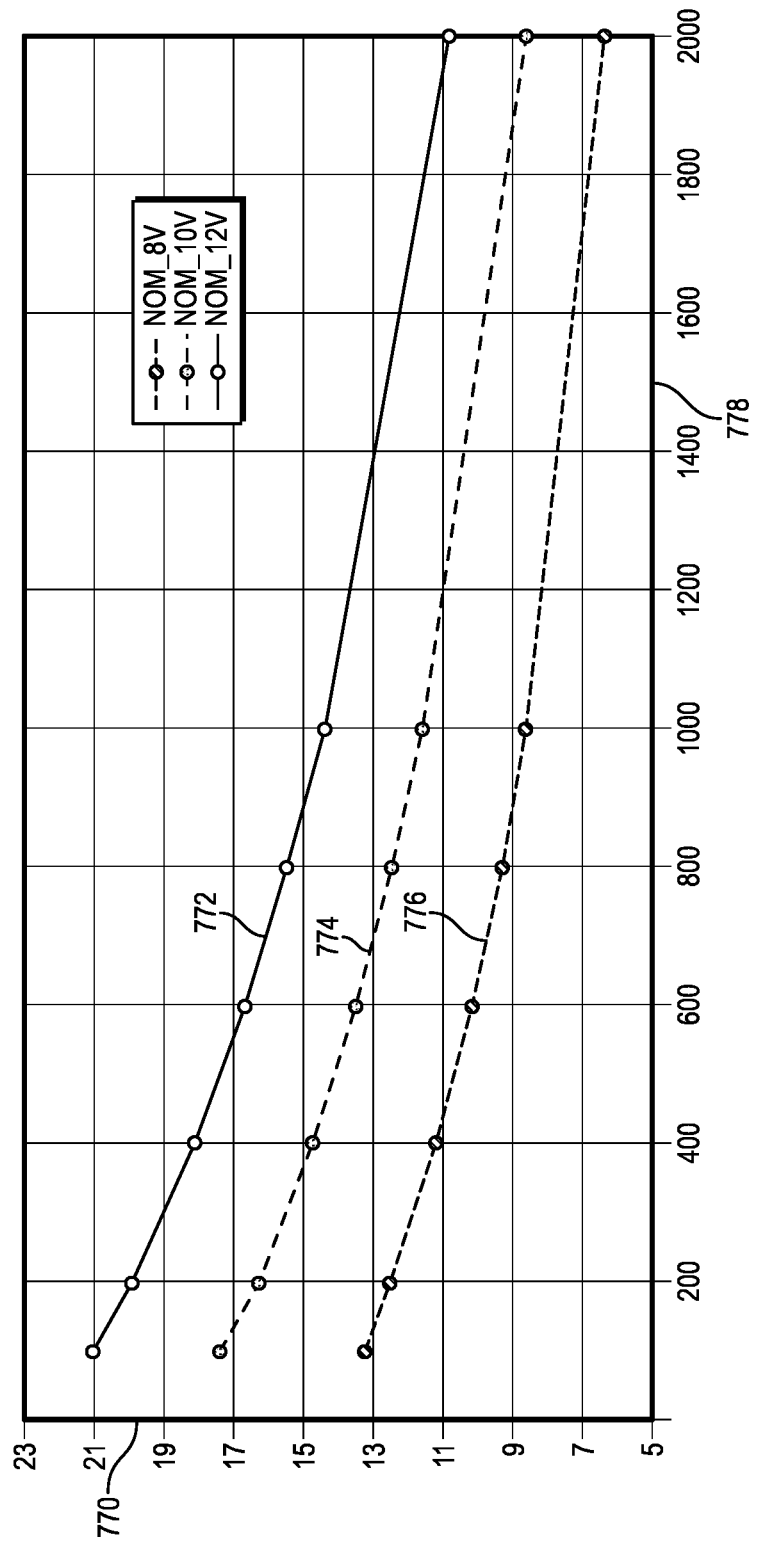
FIG. 7C shows rate of change of drain-to-source voltage as a function of time as a function of resistance value of an external resistor in the circuit of FIG. 7A.

FIG. 7B illustrates a graph 700B showing PWM voltage 740 as a function of time 748 and a rate of change of drain-to-source (Vas) 742 at turn-on of GaN power transistor 202 as a function of time. As can be seen in FIG. 7B, as resistance of the impedance element 704 is increased, a slope of drain turn-on falling edge decreases, indicating a reduction in dv/dt. Circuit 200 can enable this feature because when signal 278 goes high, a current that charges the gate 208 of GaN power transistor 202 passes through the impedance element 704 which is in series with pull-up transistor 210. In this way, dv/dt at the drain 204 can be controlled and electromagnetic interference (EMI) of the power convert can be reduced. FIG. 7C illustrates a graph showing dv/dt 770 as a function of resistance of 778 impedance element 704 of circuit 700A. Graphs 772, 774 and 776 show dv/dt as a function of resistance 778 for PWM high values of 8 V, 10 V and 12 V, respectively. As resistance value is increased from, for example, few ohms to few kilo ohms, dv/dt values can decrease from, for example, 100 V/ns to 10 V/ns.

Figure 8:
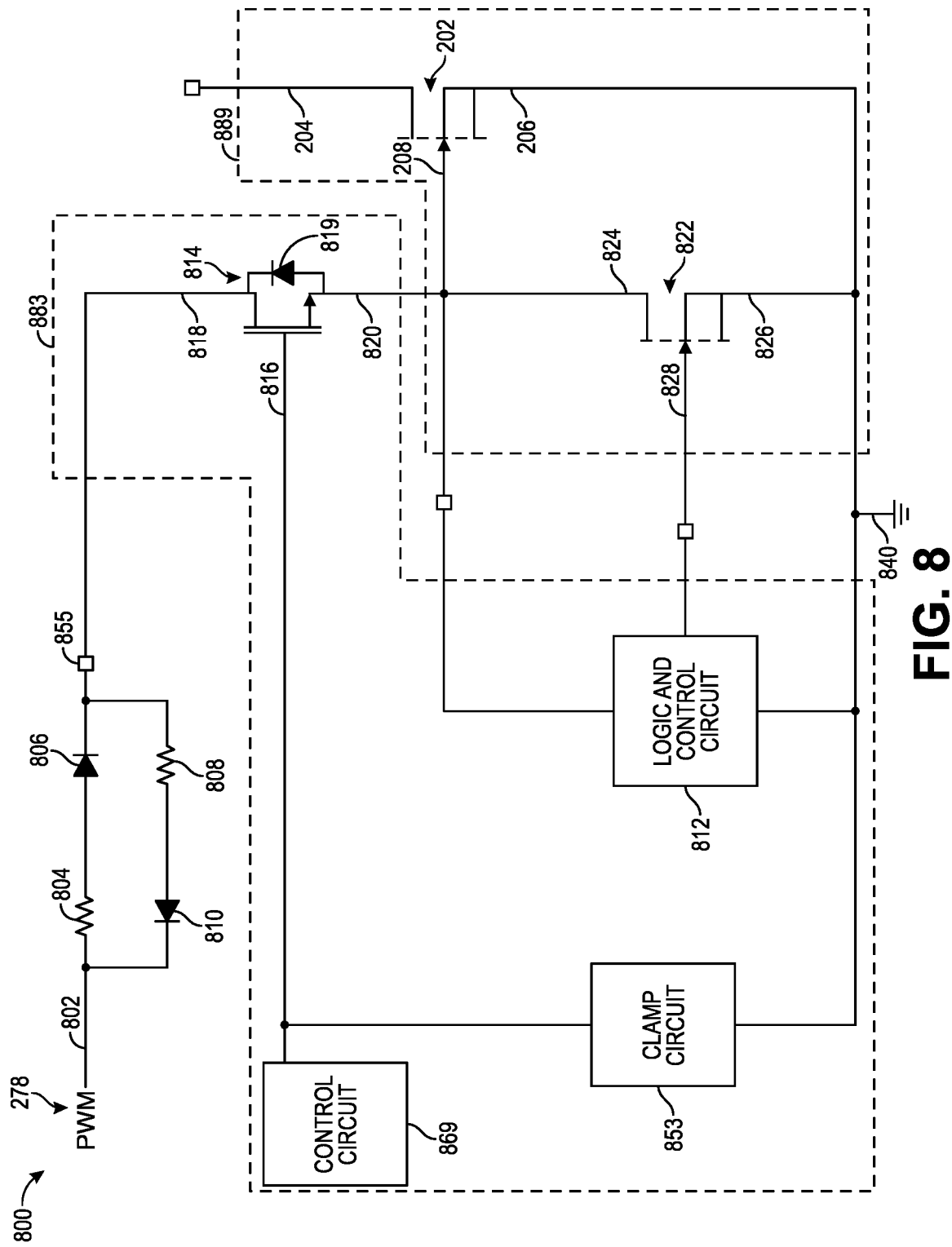
FIG. 8 illustrates schematic of a gate driver and control circuit with turn-on dv/dt control and gate clamping features, according to an embodiment of the disclosure.

FIG. 8 illustrates a schematic of a circuit 800 that includes turn-on dv/dt control and gate clamping features, according to an embodiment of the disclosure. Circuit 800 shows a gate driver and control circuit 883 coupled to a GaN-based circuit 889. Circuit 800 can be used to mitigate ringing and oscillations caused by relatively high parasitic inductances of electronic packages such as, but not limited to, TO-247 or TOLL packages that may be used as described in FIG. 1. GaN-based circuit 889 can include GaN power transistor 202 having a gate 208, a drain 204 and a source 206. GaN-based circuit 889 may further include a pull-down transistor 822 having a drain 824, a gate 828, and a source 826. Drain 824 can be connected to gate 208, while source 826 may be connected to a ground node 840. In some embodiments, GaN-based circuit 889 may be used in a high-side arrangement, where the source 826 may be connected to a switch node (Vsw) of a half-bridge. Gate driver and control circuit 883 may include a pull-up transistor 814 having a gate 816, a drain 818 and the source 820. Gate 208 may be coupled to the source 820. Pull-up transistor 814 may include a body diode 819. Drain 818 can be coupled to an input terminal pin 855. In some embodiments, gate driver and control circuit 883 can be formed on a silicon-based die while the GaN-based circuit 889 is formed on a GaN-based die. In various embodiments, gate driver and control circuit 883 may formed on the same die as the GaN-based circuit 889. In some embodiments, while gate driver and control circuit 883 is formed on a separate die than the GaN-based circuit 883, the pull-up transistor may be formed on the same die as the GaN-based circuit 889. In various embodiments, input terminal pin 855 may be connected to external components.

Circuit 800 can further include an impedance element 804, a unidirectional current conductor 806, an impedance element 808 and a unidirectional current conductor 810. An impedance element may include one or more passive components. In some embodiments, impedance element can be a resistive element, while in other embodiments impedance element can include a resistive element and a capacitive element, where the capacitive element is coupled in parallel to the resistive element. In various embodiments, the impedance element may include a network of resistive and capacitive elements. A unidirectional current conductor may include, but not limited to, a diode. Impedance element 804 may be coupled to node 802. Node 802 can be configured to receive a signal 278. In some embodiments, impedance element 804, unidirectional current conductor 806, impedance element 808 and unidirectional current conductor 810 can be external to the integrated GaN power device 100 of FIG. 1. In various embodiments, impedance element 804, unidirectional current conductor 806, impedance element 808 and unidirectional current conductor 810 can be external can be internal to integrated GaN power device 100. Source 820 can be connected to the gate 208. Pull-up transistor 814 may be a bipolar transistor, or a MOSFET. In some embodiments, pull-up transistor 814 can be a N-MOSFET, while in other embodiments pull-up transistor 814 may be a P-MOSFET.

Gate driver and control circuit 883 may include a logic circuit and control circuit 812, that is coupled to the gate 828. The control and logic circuit 812 can be configured to control a conductivity of the pull-down transistor 822. In some embodiments, pull-down transistor 822 can be GaN-based and formed on the same die as GaN power transistor 202. In various embodiments, pull-down transistor 822 can be formed on a separate die. In some embodiments, pull-down transistor 822 can be formed in silicon, or other suitable semiconductor substrates. Circuit 800 may further include a clamp circuit 853. In some embodiments, circuit 800 may not include the clamp circuit 853. Circuit 800 may further include a control circuit 869 that is arranged to control a conductivity state of the gate 816. In some embodiments, circuit 800 may not include a control circuit gate 816, instead gate 816 may be connected to input terminal pin 855 through an impedance element.

When signal 278 goes high, pull-up transistor 814 can turn on. Thus, a current can flow through impedance element 804, unidirectional current conductor 806 and transistor pull-up 814 to the gate 208. In this way, a capacitance of the gate 208 can be charged causing the GaN power transistor 202 to go into a conductive state. By setting a value for the impedance element 804, a user can control a turn-on dV/dt of the GaN power transistor 202. In this way, ringing and oscillations can be prevented, thereby keeping the GaN power transistor 202 in its safe operating area (SOA). The pull-up transistor 814 can act as a clamp to keep the GaN power transistor 202 in its SOA. The clamp circuit 853 can set a voltage at the gate 816 in such a way that a large portion of the input signal voltage may drop across the drain 818 to source 820. For example, a GaN power transistor may have a 7 V rating. The disclosed dV/dt control circuit can keep the GaN power transistor in its SOA when the input signal 278 may be, for example, at 10 to 20 V. As appreciated by one of ordinary skill in the art having the benefit of this disclosure, disclosed turn-on dV/dt control circuits can control the dV/dt for other voltage values at the input signal, for example, 1 to 50 V. Further, as appreciated by one of ordinary skill in the art, disclosed turn-on dV/dt control circuits may utilize external impedance elements to control the dV/dt. In various embodiments, the impedance element can include one or more passive components. In some embodiments, the impedance element can be a resistive element, while in other embodiments impedance element can include a resistive element and a capacitive element, where the capacitive element is coupled in parallel to the resistive element. In various embodiments, the impedance element may include a network of resistive and capacitive elements. In some embodiments, gate 816 may be controlled by other logic circuits instead of the clamp circuit 853. In various embodiments, clamp circuit 853 can be similar to the clamping circuit 295.

When signal 278 goes low, a charge on the gate 208 can discharge through the body diode 819, impedance element 808 and unidirectional current conductor 810. In this way, the charge of the gate 208 can be discharged, thus a voltage at the gate 208 can go low causing the GaN power transistor 202 to go into a non-conductive state. By setting a value for the impedance element 808, a user can control a turn-off dV/dt of the GaN power transistor 202. In this way, ringing and oscillations can be prevented, thereby keeping the GaN power transistor in the non-conductive state. Furthermore, the logic and control circuit 812 can sense a voltage at the gate 208. When the voltage drops to a value below a threshold, the logic and control circuit 812 may turn on the pull-down transistor 822 after a relatively small period. In this way, the gate 208 is kept in a low state and prevented from turning the GaN power transistor 202 from false turn-on. In some embodiments, circuit 800 can be used in a high-side configuration. In various embodiments, circuit 800 may be used in a half-bridge configuration. In some embodiments, circuit 800 can be used in a low-side configuration.

Turn-Off dI/dt Control

Figure 9:
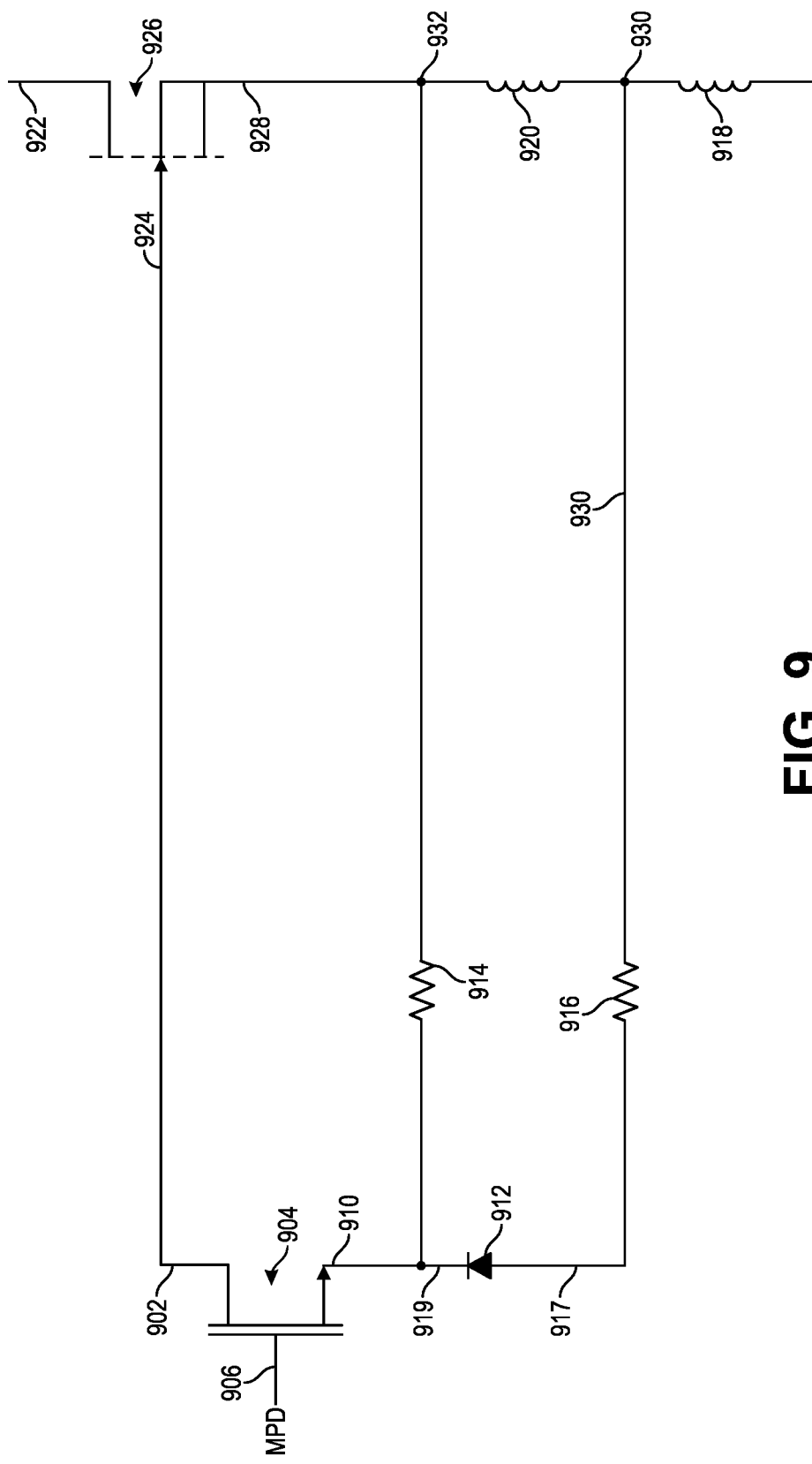
FIG. 9 illustrates schematic of a circuit with turn-off dI/dt control feature according to an embodiment of the disclosure.

FIG. 9 illustrates schematic of a circuit 900 with turn-off dI/dt control feature according to an embodiment of the disclosure. Circuit 900 can be used to mitigate the relatively high parasitic inductances of TO-247 or TOLL packages. Circuit 900 can include a GaN power transistor 926 with a source 928, a gate 924 and a drain 922. In some embodiments, the GaN power transistor can be connected within its package by connecting bondwires between GaN transistor die and its package. The bondwires can have inductances associated with them. Circuit 900 shows an inductance 920 of a bondwire with an inductance value L. For example, bondwire inductance can be created by a down-bond between a source 928 of the GaN power transistor 926 and a package pad. Element 918 represents inductance of package to the printed circuit board. The bondwire inductance L of 920 can be utilized to sense rate of change of current as a function of time (dI/dt) in the source of the GaN power transistor 926. When the GaN power transistor is turned off, the current through the source of the GaN power device decreases. This can cause a value of a voltage across inductance 920, which is given by L×dI/dt to change rapidly. The voltage across inductance 920 is sensed by impedance elements 914 and 916. Impedance element 914 is connected a cathode 919 of a diode 912 and impedance element 916 is connected to an anode 917 of diode 912.

The sensed voltage is fed back into a source 910 of a transistor 904. A drain 902 of the transistor 904 can be connected to a gate 924 of the GaN power transistor 926. In some embodiments, the transistor 904 can be a silicon transistor, while in other embodiments, it can a GaN transistor, which can be integrated within the same die as that of the GaN power transistor 926. A voltage at the source 910 of the transistor 904 can increase when a voltage across inductance 920 increases because the voltage across inductance 920 is fed back into source 910 with a positive polarity. When the voltage at source 910 of the transistor 904 increases, the gate-to-source voltage ($V_{gs}$) can decrease, which can cause pull transistor 904 to have less drive. This in turn can reduce a turn-off speed of the GaN power transistor 926. The more voltage that is developed across inductance 920, the less drive transistor 904 can have, which in turn can slow down the turn-off of the GaN power transistor 926. It will be understood by those skilled in the art that transistor 904, impedance elements 914 and 916 and diode 912 can be formed in GaN and integrated within the same die as that of GaN power transistor 926, or can be form in silicon, or some components may be formed in GaN while other components are formed in silicon.

In some embodiments, feedback of voltage across inductance 920 can be used to modulate a voltage on gate 906 of the transistor 904 in order to reduce the pull down drive and to slow down turn-off of GaN power transistor 926. The source 910 of transistor 904 can be connected to source 928 of GaN power transistor 926, while a voltage at gate 906 of transistor 904 is modulated in order to adjust the drive capability of the transistor 904. In various embodiments, inductance L of inductance 920 can vary because of manufacturing variations. Circuit 900 can compensate for the variations of the value of inductance L. For example, if value of inductance L decrease, the signal developed across inductance 920 decreases as well, however this signal will be adequate to provide a feedback into the transistor 904 since the value of L×dI/dt of the GaN power transistor has decreased also.

In some embodiments, the turn-off dI/dt control can control a voltage spike across the driver as well as across drain-source of the power transistor 926. The turn-off dI/dt control can mitigate these spikes irrespective of the value of the inductance L. For example, if value of inductance L decrease, then turn-off dI/dt control system can mitigate higher dI/dt. The turn-off dI/dt control can mitigate the voltage spikes so long as L×dI/dt turns on the feedback loop which includes impedance element 916, diode 912 and impedance element 914. In various embodiments, diode 912 can provide feedback of the positive voltage across the bondwire inductance 920 (i.e., node 930 being positive relative to node 932). In this way, the turn-off dI/dt control system can prevent voltage ringing being feedback into the system, which can cause high frequency oscillation. It will be understood by those skilled in the art that the described turn-off dI/dt control system and circuit can be utilized in any power conversion circuit including a power transistor, including, but not limited t, GaN and/or silicon power transistors when a bondwire inductance 920 is available.

Gate Driver Circuit with Hysteresis

Figure 10:
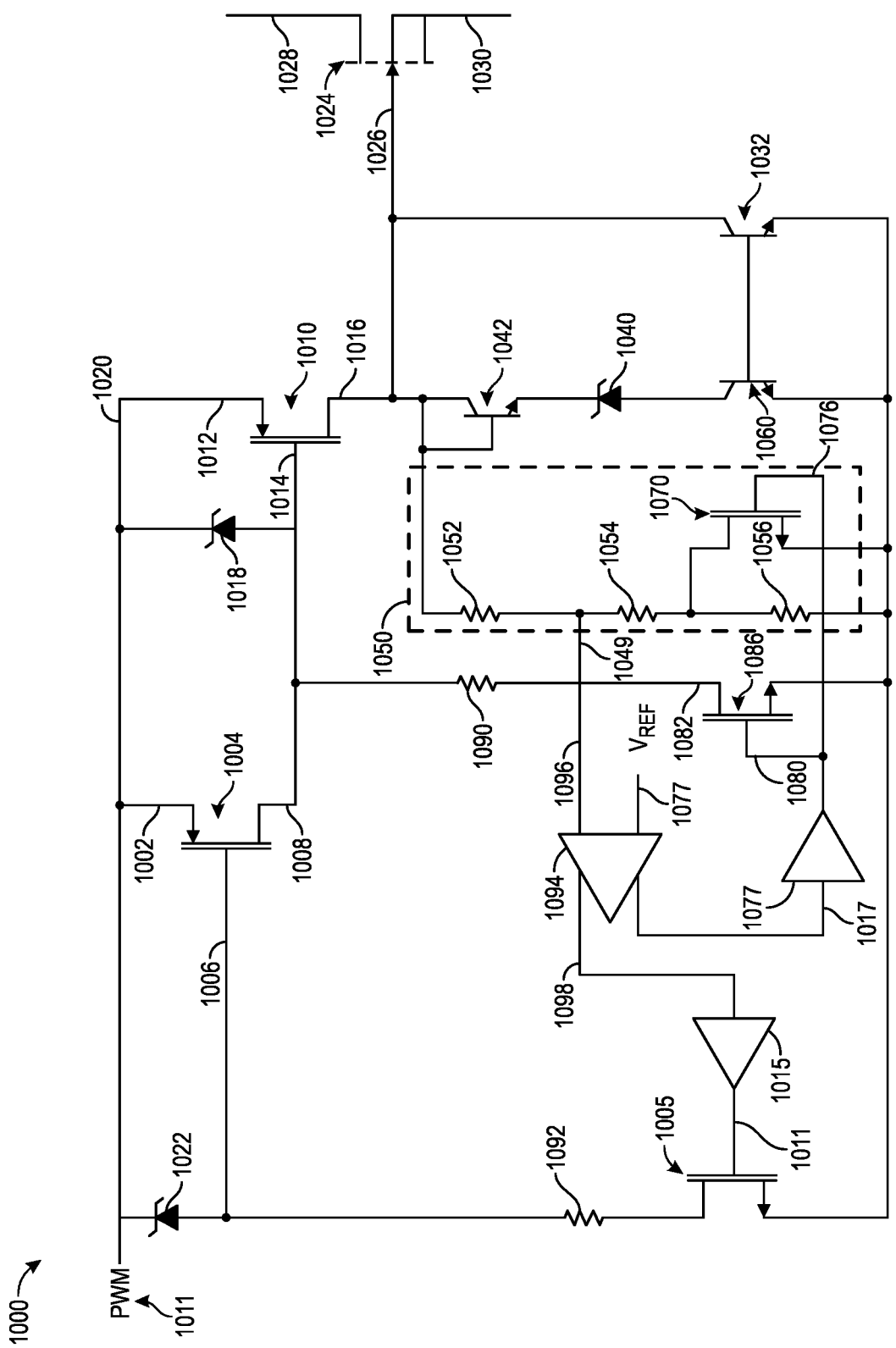
FIG. 10 illustrates schematic of a gate driver circuit with hysteresis according to an embodiment of the disclosure.

FIG. 10 illustrates schematic of a gate driver circuit 1000 with hysteresis according to an embodiment of the disclosure. Circuit 1000 can be used within circuit 200 to provide a gate driving with hysteresis technique that can be utilized to drive the GaN power transistor 202. Circuit 1000 can include a GaN power transistor 1024 with a source 1030, a gate 1026 and a drain 1028. Circuit 1000 can include a rail 1020 that is configured to receive PWM signal 1011. When PWM signal 1011 is high, it can turn on Transistor 1010, which can start charging the gate 1026 of the GaN power transistor 1024. A source 1012 of Transistor 1010 can be connected to the rail 1020 which is connected to the input PWM signal 1011. A Zener diode 1018 can be connected to the gate 1014 of Transistor 1010 to clamp a voltage at the gate 1014 of Transistor 1010. The gate of the GaN power transistor 1024 can be connected to a feedback and hysteresis circuit 1050. The feedback and hysteresis circuit can include a resistor divider formed by resistors 1052, 1054 and 1056, and a transistor 1070. A comparator 1094 can have its first input 1096 connected to an output 1049 of the resistor divider formed by resistors 1052, 1054 and 1056. Comparator 1094 can monitor a voltage at the gate of the GaN power transistor 1024 through the resistor divider. When gate of the GaN power transistor 1024 is low, a drain 1016 of Transistor 1010 is low, thus Transistor 1010 can turn on and charge the gate of the GaN power transistor 1024. The voltage at the gate 1026 of the GaN power transistor goes high when it is charged.

Comparator 1094 can detect a high state of the gate of the GaN power transistor 1024 by comparing a voltage at its first input 1096 and a reference voltage $V_{ref}$ at node 1077. When the voltage at the first input 1096 goes high, the comparator 1094 switches and its output 1098 can go high. Output 1098 can then turn on transistor 1005 through buffer 1015. Transistor 1005 can be connected to gate 1006 of PMOS transistor 1004 through resistor 1092. When transistor 1005 turns on, a voltage at gate 1006 of a PMOS transistor 1004 goes low, turning on PMOS transistor 1004. A source 1002 of PMOS transistor 1004 can be connected to the rail 1020 and a drain 1008 can be connected to a gate 1014 of transistor 1010. A Zener diode 1022 can be connected to the gate 1006 of PMOS transistor 1004 to clamp its gate voltage and prevent damage to its gate. When PMOS transistor 1004 turns on, it can turn off Transistor 1010. Thus, the gate of the GaN power transistor can stay at a high state. If the voltage at the gate of the GaN power transistor drops due to leakage through parasitic elements, the comparator 1094 can turn back on due to hysteresis and turn Transistor 1010 back on and charge the gate of the GaN power transistor.

Circuit 1000 can enable use of PWM signals with wide range of voltage variations, for example from 5 V to 30 V, by utilizing a pull-up transistor 1010. When pull-up transistor 1010 is introduced into circuit 1000, its gate 1014 can be controlled by utilizing the feedback and hysteresis circuit 1050. Circuit 1000 can include a buffer 1019 which can control a gate 1080 of transistor 1086 and a gate 1076 of transistor 1070. When the gate of GaN power transistor 1024 is in high state, an inverted output 1017 of the comparator 1094 is in high state. The inverted output 1017 drives gate 1080 of transistor 1086 through buffer 1019 and turns transistor 1086 off, which can allow a voltage at drain 1082, which is connected to resistor 1090, to move up towards a voltage at a rail 1020 to enable turn-off of transistor 1010. At the same time, transistor 1005 can turn on, resulting in a turn off of the transistor 1004. Transistors 1032, 1060, and 1042 in combination with Zener diode 1040 form a clamping circuit for the gate 1026 of the GaN power transistor 1024 in order to prevent the gate voltage from exceeding its safe operating region. Circuit 1000 enables driving of the gate of the GaN power transistor 1024 at relatively low PWM voltages, while enabling the driving of the gate of the GaN power transistor 1024 at relatively high PWM voltages as well.

Figure 11:
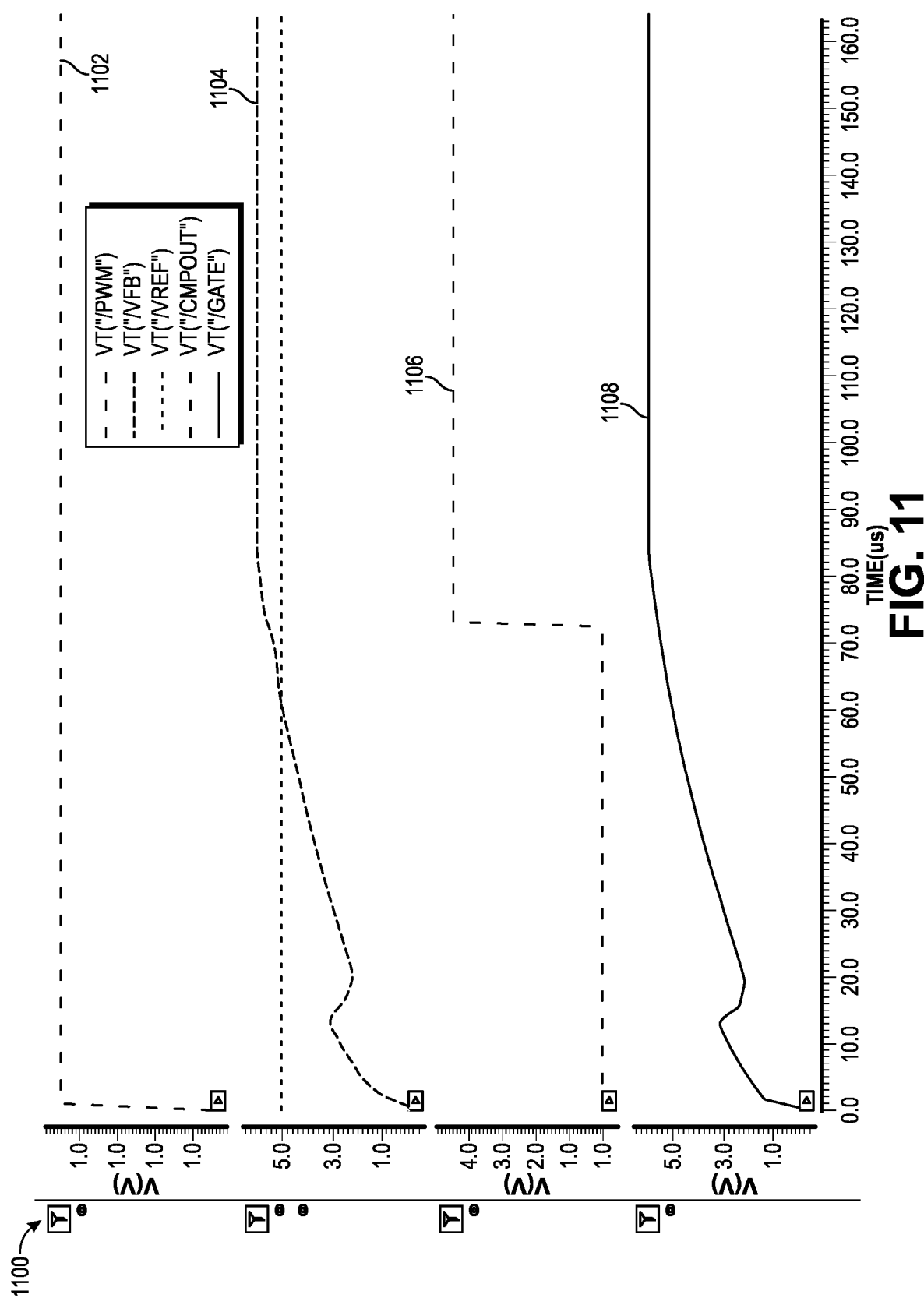
FIG. 11 illustrates voltages at various nodes within the gate circuit of FIG. 10.

FIG. 11 illustrates a graph 1100 showing voltages at various nodes within circuit 1000. Graph 1102 shows PWM signal going high. Graph 1104 shows comparator input voltage at first input 1096 going high. Graph 1106 shows comparator output 1098 voltage going high. Graph 1108 shows the voltage at the gate of the GaN power transistor 1024 going high.

In various embodiments, hysteresis can be implemented, for example, within the comparator 1094 itself. The comparator can have hysteresis, or the comparator may use two different levels of reference voltages. In some embodiments, the gate driver circuit with hysteresis can control the pull-up transistor 1010 transistor in various ways. In some embodiments, the gate driver with hysteresis can function without having the gate clamping circuit which includes transistors 1032, 1060, and 1042. The gate driver circuit with hysteresis can function with or without the clamping circuit. In various embodiments, gate driver with hysteresis can be used in numerous gate driver applications. In addition, gate driver with hysteresis circuit may be used as a voltage regulator as illustrated in FIG. 12.

Figure 12:
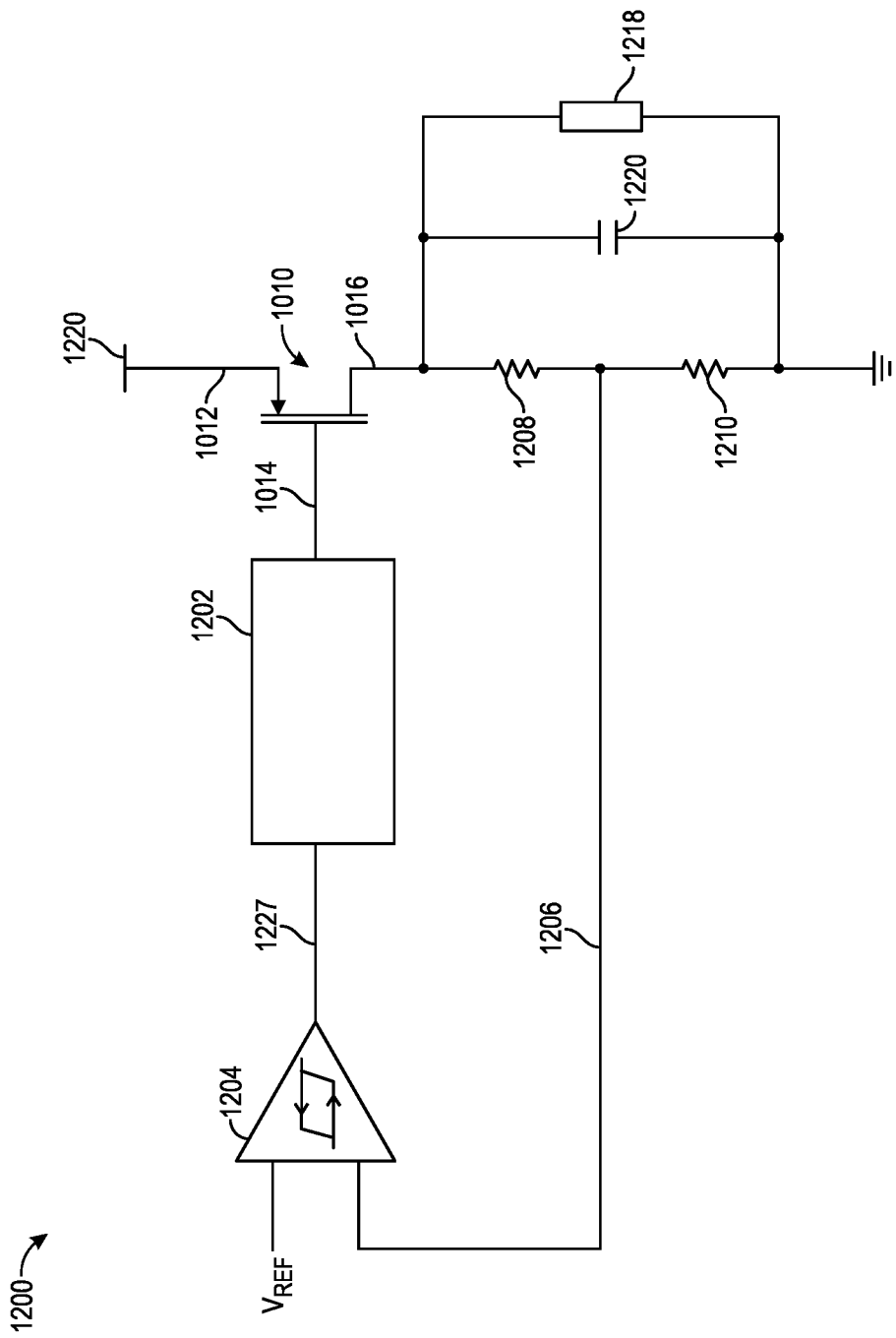
FIG. 12 illustrates schematic of a voltage regulator in accordance with an embodiment of the disclosure.

FIG. 12 illustrates schematic of a voltage regulator 1200 in accordance with an embodiment of the disclosure. Voltage regulator 1200 can regulate a gate voltage of the transistor 1010 of circuit 1000. The drain 1016 may be connected to a capacitor 1220 and a load 1218. Resistors 1208 and 1210 can form a resistor divider arranged to provide feedback signal. The feedback signal can be generated at node 1206 that feeds into an input of a comparator 1204. Comparator 1204 can have hysteresis. Comparator 1204 can compare the voltage at node 1206 to a reference voltage Vref and provide a voltage at node 1227 to a controller circuit 1202. The controller circuit 1202 can regulate a gate voltage of the transistor 1010.

Figure 13:
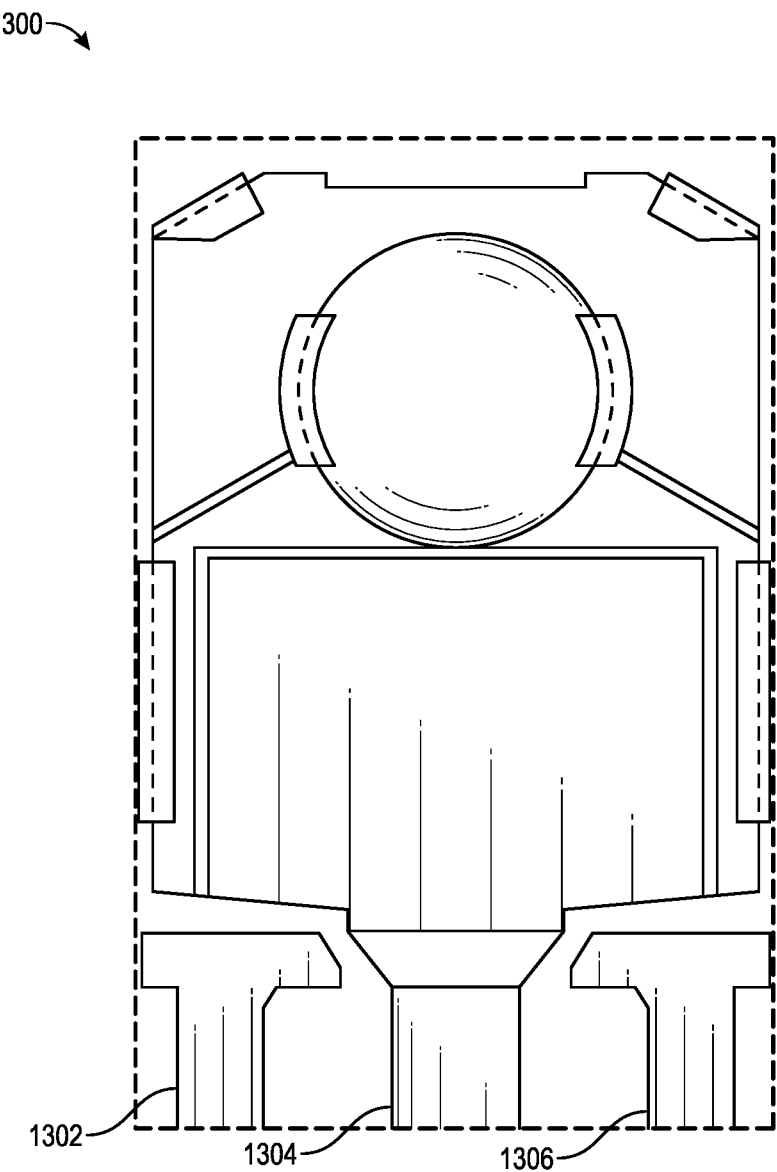
FIG. 13 illustrates an integrated GaN power device in a TO-247 package according to an embodiment of the disclosure.

FIG. 13 illustrates an integrated GaN power device 1300 according to an embodiment of the disclosure. As shown in FIG. 13, integrated GaN power device 1300 can use a TO-247 package in order to integrate the gate driver IC 112 and the integrated GaN power transistor 114. The integrated GaN power device 1300 can include a source terminal 1302, a drain terminal 1304 and a PWM terminal 1306. The integrated GaN power device 1300 can be a compatible replacement for a power MOSFET in a TO-247 package and its driving circuits.

Figure 14A:
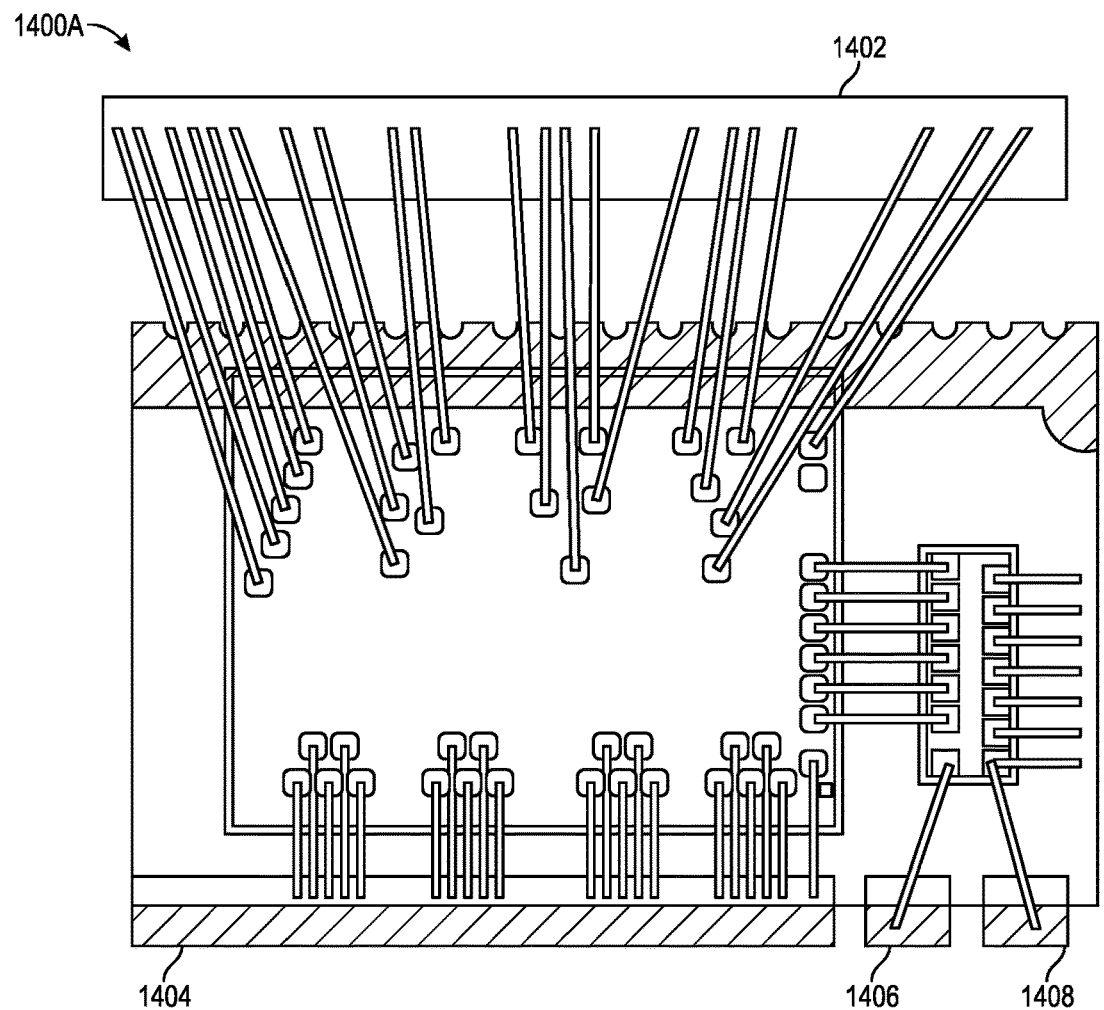
FIG. 14A illustrates an integrated GaN power device according to an embodiment of the disclosure.
Figure 14B:
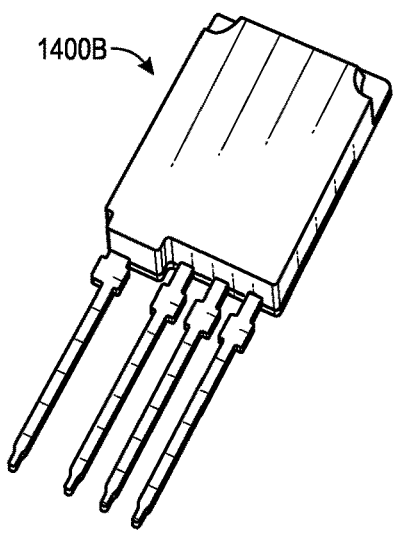
FIG. 14B illustrates an integrated GaN power device in a four-terminal TO-247 package according to an embodiment of the disclosure.
Figure 14C:
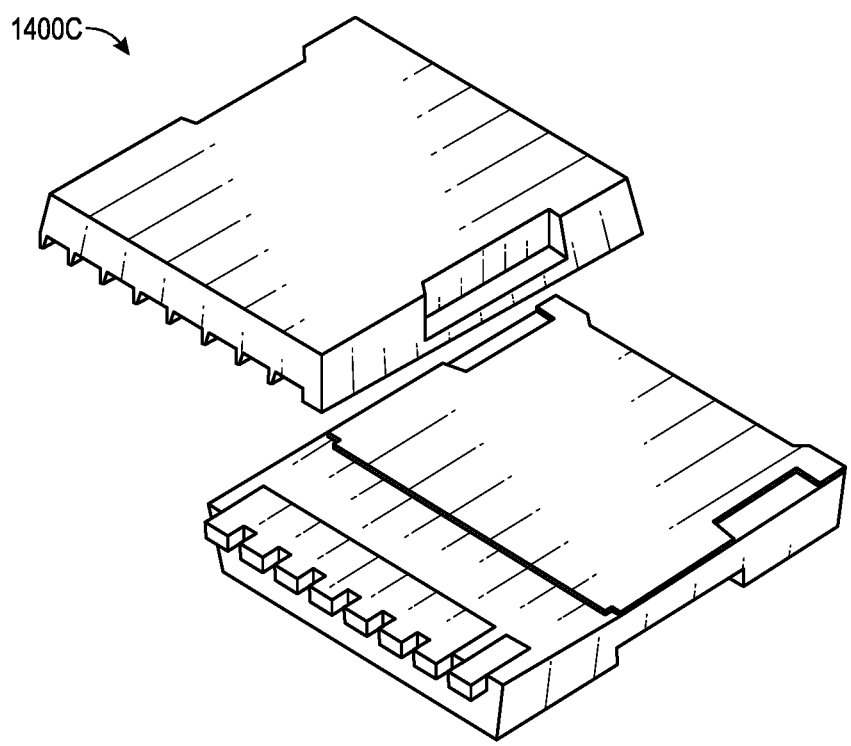
FIG. 14C illustrates an integrated GaN power device in a TO-leadless (TOLL) package according to an embodiment of the disclosure.

FIG. 14A illustrates an integrated GaN power device 1400A according to an embodiment of the disclosure. As shown in FIG. 14A, integrated GaN power device 1400A can use a TO-247 or TO-leadless (TOLL) package in order to integrate the gate driver IC 112 and the GaN power transistor 114. In the illustrated embodiment, the integrated GaN power device 1400A can include a source terminal 1404, a drain terminal 1402, a PWM terminal 1408 and kelvin source 1406. In some embodiments, the integrated GaN power device 1400A may not include a kelvin source and may use a three-terminal TO-247 package or a three-terminal TOLL package. In various embodiments, the integrated GaN power device 1400A can be a compatible replacement for a power MOSFET in a three-terminal or a four-terminal TO-247 package and its driving circuits. In numerous embodiments, the integrated GaN power device 1400A can be a compatible replacement for a power MOSFET in a three-terminal or a four-terminal TOLL package and its driving circuits. FIG. 14B illustrates an integrated GaN power device 1400B in a four-terminal TO-247 package according to an embodiment of the disclosure. FIG. 14C illustrates an integrated GaN power device 1400C in a TOLL package according to an embodiment of the disclosure.

Although integrated power devices with energy harvesting gate drivers are described and illustrated herein with respect to one particular configuration of GaN integrated power device, embodiments of the disclosure are suitable for use with other configurations of GaN devices and non-GaN devices. For example, any semiconductor device can be used with embodiments of the disclosure. In some instances, embodiments of the disclosure are particularly well suited for use with silicon and other compound semiconductor devices.

For simplicity, various internal components, such as the details of the substrate, various lead frame, and other components of integrated GaN power device 100 (see FIG. 1) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A circuit comprising:
a first transistor including a first drain terminal, a first gate terminal and a first source terminal;
a depletion-mode transistor including a second drain terminal, a second gate terminal and a second source terminal, the second drain terminal connected to the first drain terminal, the depletion-mode transistor arranged to sense a first voltage at the first drain terminal and generate a second voltage at the second source terminal; and
a comparator arranged to receive the second voltage, and transition the first transistor from an on state to an off state in response to the first transistor entering its saturation region of operation.

2. The circuit of claim 1, wherein the first transistor comprises gallium nitride (GaN).

3. The circuit of claim 1, wherein the depletion-mode transistor comprises GaN.

4. The circuit of claim 1, further comprising a logic circuit arranged to receive an output voltage generated by the comparator and to drive the first gate terminal.

5. The circuit of claim 1, further comprising a logic circuit arranged to receive an output voltage generated by the comparator and to drive the first and second gate terminals.

6. The circuit of claim 1, wherein the comparator is further arranged to transition the first transistor from an off-state to an on-state in response to the first transistor exiting its saturation region of operation.

7. The circuit of claim 1, wherein the second gate terminal is coupled to a ground node.

8. The circuit of claim 1, wherein the second source terminal is coupled to a resistor divider circuit.

9. The circuit of claim 4, wherein the logic circuit comprises a first output drive and a second output drive.

10. The circuit of claim 9, wherein the first output drive is coupled to the first gate terminal and the second output drive is coupled to the second gate terminal.

11. A method of operating a circuit, the method comprising:
providing a first transistor including a first drain terminal, a first gate terminal and a first source terminal;
sensing, by a depletion-mode transistor, a voltage at the first drain terminal, wherein the depletion-mode transistor includes a second drain terminal, a second gate terminal and a second source terminal, and wherein the second drain terminal is connected to the first drain terminal;

generating, by the depletion-mode transistor, a second voltage at the second source terminal; and receiving, by a comparator, the second voltage; and transitioning, by the comparator, the first transistor from an on state to an off state in response to the first transistor entering its saturation region of operation.

12. The method of claim 11, wherein the first transistor comprises gallium nitride (GaN).

13. The method of claim 11, wherein the depletion-mode transistor comprises GaN.

14. The method of claim 11, further comprising receiving, by a logic circuit, an output voltage generated by the comparator and driving, by the logic circuit, the first gate terminal.

15. The method of claim 11, further comprising receiving, by a logic circuit, an output voltage generated by the comparator and driving, by the logic circuit, the first and second gate terminal.

16. The method of claim 11, wherein the comparator is arranged to transition the first transistor from an off-state to an on-state in response to the first transistor exiting its saturation region of operation.

17. The method of claim 11, wherein the second gate terminal is coupled to a ground node.

18. The method of claim 11, wherein the second source terminal is coupled to a resistor divider circuit.

19. The method of claim 14, wherein the logic circuit comprises a first output drive and a second output drive.

20. The method of claim 19, wherein the first output drive is coupled to the first gate terminal and the second output drive is coupled to the second gate terminal.

* * * * *